United States Patent
Park

(10) Patent No.: US 12,461,278 B2
(45) Date of Patent: Nov. 4, 2025

(54) LIGHT EMITTING ELEMENT, DISPLAY DEVICE INCLUDING THE SAME, AND CHARGE TRANSPORT MATERIAL FOR THE LIGHT EMITTING ELEMENT

(71) Applicant: Samsung Display Co., Ltd., Yongin-si (KR)

(72) Inventor: Junwoo Park, Daejeon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1035 days.

(21) Appl. No.: 17/511,114

(22) Filed: Oct. 26, 2021

(65) Prior Publication Data

US 2022/0285618 A1 Sep. 8, 2022

(30) Foreign Application Priority Data

Mar. 5, 2021 (KR) .......................... 10-2021-0029291

(51) Int. Cl.
  *G02B 1/04* (2006.01)
  *C08K 5/28* (2006.01)
  (Continued)

(52) U.S. Cl.
  CPC .................. *G02B 1/04* (2013.01); *C08K 5/28* (2013.01); *C09K 11/06* (2013.01); *G06F 1/1652* (2013.01);
  (Continued)

(58) Field of Classification Search
  CPC ........... C08K 5/28; C09K 11/06; H10K 71/12
  See application file for complete search history.

(56) References Cited

U.S. PATENT DOCUMENTS

| 6,372,154 B1 | 4/2002 | Li |
| 9,611,216 B2 | 4/2017 | Pei et al. |
| (Continued) | | |

FOREIGN PATENT DOCUMENTS

| CN | 111354860 A | | 6/2020 |
| KR | 20110090566 A | * | 8/2011 |
| (Continued) | | | |

OTHER PUBLICATIONS

Rumer et al., Materials Today 2015, 18, 425-435. (Year: 2015).*
(Continued)

*Primary Examiner* — Dylan C Kershner
(74) *Attorney, Agent, or Firm* — CANTOR COLBURN LLP

(57) ABSTRACT

A light-emitting element includes a first electrode, a second electrode disposed on the first electrode, and at least one functional layer disposed between the first electrode and the second electrode. The at least one functional layer includes a charge transport material derived from an azide compound represented by Formula 1 and a polymer compound including an aromatic ring group. The light-emitting element may be formed by a wet process and may exhibit improved flexibility.

Formula 1

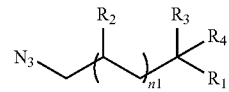

18 Claims, 8 Drawing Sheets

(51) Int. Cl.
*C09K 11/06* (2006.01)
*G06F 1/16* (2006.01)
*H10K 50/15* (2023.01)
*H10K 59/10* (2023.01)
*H10K 71/12* (2023.01)
*H10K 85/10* (2023.01)

(52) U.S. Cl.
CPC ........... H10K 71/12 (2023.02); H10K 85/146 (2023.02); *H10K 50/15* (2023.02); *H10K 59/10* (2023.02)

(56) References Cited

U.S. PATENT DOCUMENTS

| | | | | |
|---|---|---|---|---|
| 2007/0172978 | A1* | 7/2007 | Chua | H10K 85/151 |
| | | | | 438/99 |
| 2009/0072722 | A1* | 3/2009 | Dowling | H05B 33/14 |
| | | | | 313/504 |
| 2015/0022090 | A1* | 1/2015 | Kim | H10K 71/00 |
| | | | | 315/130 |
| 2016/0002164 | A1* | 1/2016 | Pei | C07C 19/07 |
| | | | | 570/252 |
| 2020/0203612 | A1* | 6/2020 | Park | H10K 85/151 |

FOREIGN PATENT DOCUMENTS

| | | |
|---|---|---|
| KR | 20150011230 A | 1/2015 |
| KR | 101601362 B1 | 3/2016 |
| KR | 20200078804 A | 7/2020 |

OTHER PUBLICATIONS

Park et al., machine translation of KR-20110090566-A (2011) pp. 1-5. (Year: 2011).*

Jiajie Liang, et al., Elastomeric polymer light-emitting devicesand displays, Nature Photonics, vol. 7, Oct. 2013, 817-824.

Junwoo Park, et al., Facile Photo-Crosslinking of Azide-Containing Hole-Transporting Polymers for Highly Efficient, . . . Adv. Funct. Mater. 2014, 24, 7588-7596.

* cited by examiner

LIGHT EMITTING ELEMENT, DISPLAY DEVICE INCLUDING THE SAME, AND CHARGE TRANSPORT MATERIAL FOR THE LIGHT EMITTING ELEMENT

CROSS-REFERENCE TO RELATED APPLICATIONS

This U.S. patent application claims priority under 35 U.S.C. § 119 to Korean Patent Application No. 10-2021-0029291, filed on Mar. 5, 2021, the entire contents of which are herein incorporated by reference.

BACKGROUND

The present disclosure relates to a light-emitting element, a display device including the light-emitting element, and a charge transport material for the light-emitting element.

An organic light-emitting diode, which is a self-luminous element, emits light from a recombination of holes and electrons injected from a first electrode and a second electrode in a light-emitting layer. The organic light-emitting diode may be used in a display, including a flexible display device, in which a light-emitting material containing an organic compound present in a light-emitting layer emits light.

Recently, research has been conducted to improve the performance or flexibility of a flexible display device including an organic light-emitting diode.

SUMMARY

The present disclosure provides a light-emitting element having an improved performance or flexibility, and thus, improved performance or flexibility of a display device including the same.

The present disclosure also provides a charge transport material.

The present disclosure also provides a charge transport material that may be achieved by wet processing.

An embodiment of the inventive concept provides a light-emitting element including a first electrode, a second electrode disposed on the first electrode, and at least one functional layer disposed between the first electrode and the second electrode, the at least one functional layer including a charge transport material that is derived from a mixture of an azide compound represented by Formula 1 and a polymer compound including an aromatic ring group.

Formula 1

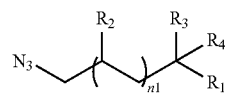

wherein, in Formula 1, n1 is an integer of 1 to 9, $R_1$ and $R_2$ are each independently a hydrogen atom or an optionally substituted alkyl group having 1 to 10 carbon atoms, $R_3$ and $R_4$ are each independently a hydrogen atom or an optionally substituted alkyl group having 1 to 9 carbon atoms.

In an embodiment, the charge transport material may be formed by crosslinking the polymer compound with the azide compound.

In an embodiment, in the charge transport material, a mole ratio of moles of the azide compound to moles of the polymer compound may be about 1:1.85 to about 1:3.0.

In an embodiment, the polymer compound may include poly(triphenylamine), poly(9,9-dioctylfluorene-alt-N-(4-sec-butylphenyl)-diphenylamine), poly(p-phenylenevinylene), polythiophenes, poly(p-phenylene), polyfluorenes, or cyano-poly(p-phenylene vinylene), or the polymer compound may be a polyvinylcarbazole represented by Formula 4.

Formula 4

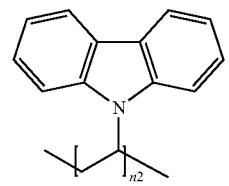

wherein, in Formula 4, n2 is an integer of 100 to 300.

In an embodiment, the at least one functional layer may be: a light-emitting layer disposed between the first and second electrodes; a hole transport region disposed between the first electrode and the light-emitting layer; or an electron transport region disposed between the light-emitting layer and the second electrode, and the hole transport region may include the charge transport material.

In an embodiment, the hole transport region may include a hole injection layer disposed on the first electrode and a hole transport layer disposed on the hole injection layer, and at least one of the hole injection layer or the hole transport layer may include the charge transport material.

In an embodiment, the electron transport region may include the charge transport material.

In an embodiment, the light-emitting layer may include the charge transport material.

In an embodiment, the azide compound may be represented by a compound of Compound Group 1.

Compound Group 1

1

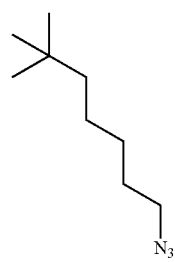

2

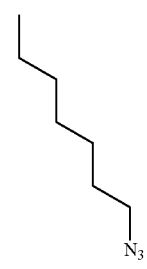

3

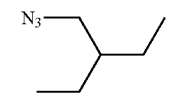

In an embodiment of the inventive concept provides a display device including a base layer and a light-emitting element disposed on the base layer, wherein the light-emitting element includes a first electrode and a second electrode disposed on the first electrode; and at least one functional layer disposed between the first electrode and the second electrode, the at least one functional layer including a charge transport material derived from a mixture of an azide compound represented by Formula 1 and a polymer compound including an aromatic ring group.

In an embodiment, the display device may have a first state in which the display device has a first area on a plane; and a second state in which the display device may have a second area on the plane that is larger than the first area.

In an embodiment, the display device may have a folded state and a non-folded state, and the display device may include a folding region that is folded with respect to a folding axis which is a virtual line extending in a first direction in the folding state, and a first non-folding region and a second non-folding region, which are spaced apart from each other in a second direction perpendicular to the first direction.

In an embodiment, the at least one functional layer may include a light-emitting layer disposed between the first and second electrodes, a hole transport region disposed between the first electrode and the light-emitting layer, or an electron transport region disposed between the light-emitting layer and the second electrode, and the hole transport region may have a hole injection layer disposed on the first electrode and a hole transport layer disposed on the hole injection layer, and at least one of the hole injection layer or the hole transport layer may contain the charge transport compound.

In an embodiment, the electron transport region may include an electron injection layer disposed on the light emitting layer and an electron transport layer disposed between the light emitting layer and the electron injection layer, and at least one of the light-emitting layer, the electron injection layer, or the electron transport layer may include the charge transport material.

In an embodiment, the at least one functional layer may be formed by applying the charge transport material by a wet process.

In an embodiment, the at least one functional layer may be formed by curing the charge transport material using heat or ultraviolet rays.

In an embodiment of the inventive concept provides a charge transport material derived from a mixture of an azide compound represented by Formula 1 and a polymer compound including an aromatic ring group.

In an embodiment, with respect to the total number of moles of the azide compound and the polymer compound in the charge transport material, the mole percent of the azide compound may be about 25 mol % to about 35 mol %.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
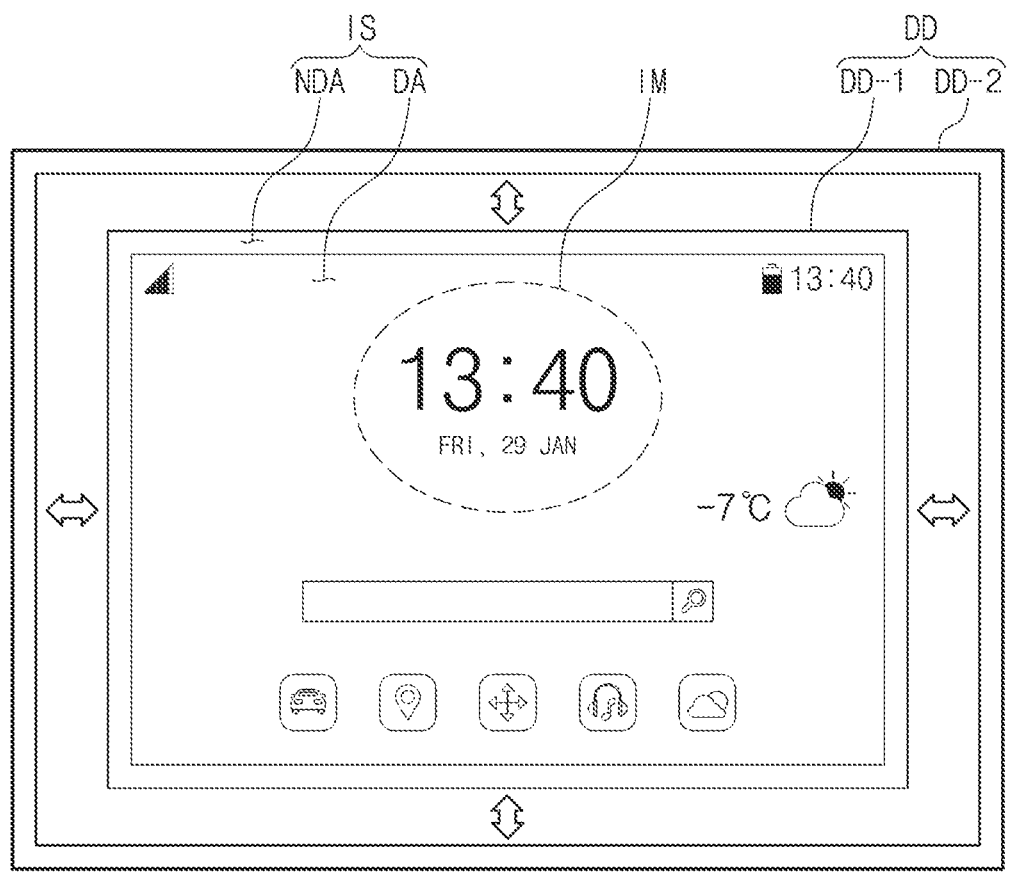
FIG. 1A is a plan view of a display device according to an embodiment.
Figure 1A:
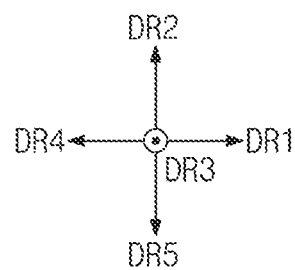

As the inventive concept allows for various changes and numerous embodiments, particular embodiments will be illustrated in the drawings and described in detail in the text. However, this is not intended to limit the present invention to the specific disclosed form, it should be understood to include all modifications, equivalents, and substitutes included in the spirit and scope of the present invention. Like numbers refer to like elements throughout. The thickness and the ratio and the dimension of the element are exaggerated for effective description of the technical contents.

It will be understood that when an element or layer is referred to as being "on", "connected to" or "coupled to" another element or layer, it can be directly on, connected or coupled to the other element or layer, or intervening elements or layers may be present. For example, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terms first, second, etc. may be used to describe various elements, components, regions, layers and/or sections, these elements, components, regions, layers and/or sections should not be limited by the terms. The terms are used only to distinguish one element, component, region, layer, or section from another element, component, region, layer, or section. For example, without departing from the scope of the present invention, the first "element," "component," "region," "layer" or "section" discussed below could be termed a second element, component, region, layer, or section without departing from the teachings herein.

In addition, terms such as "below", "under", "above", "on", etc. are used to describe the relationship between the components shown in the drawings. The terms are relative concepts and are explained based on the directions indicated in the drawings. Accordingly, it will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an embodiment of the present invention will be described in detail with reference to the accompanying drawings.

FIG. 1A is a plan view illustrating a display device DD according to an embodiment. Referring to FIG. 1A, the display device DD may display an image IM through a display surface IS. The display surface IS may include a display region DA in which an image IM is displayed and a non-display region NDA adjacent to the display region DA. The non-display region NDA may be a region in which an image is not displayed.

The display region DA may have a rectangular shape. The non-display region NDA may surround the display region DA. However, an embodiment of the inventive concept is not limited thereto, and the shape of the display region DA and the shape of the non-display region NDA may be relatively designed. In addition, the non-display region NDA may not exist on the front surface of the display device DD.

The display device DD may be activated in response to an electrical signal. For example, the display device DD may be a personal digital terminal, a tablet, a car navigation unit, a game machine, or a wearable device, but an embodiment of the inventive concept is not limited thereto. FIG. 1A illustrates that the display device DD is a portable electronic device.

The display device DD may be a flexible display device. In FIG. 1A, the display device DD may be a stretchable display device. The display device DD may extend by an external force in a direction parallel to at least one of a first direction axis DR1, a second direction axis DR2, a third direction axis DR3, or a fourth direction axis DR4. The display device DD may have a first state DD-1 in which the display device DD is not extended, and a second state DD-2 in which the display device DD has been extended by an external force. In the first state DD-1, the display device DD may have a first area, and in the second state DD-2, the display device DD may have a second area. On a plane, the second area may be larger than the first area.

On a plane, the first direction axis DR1 and the second direction axis DR2 may be mutually orthogonal. The first direction axis DR1 and the fourth direction axis DR4 may extend in opposite directions on a straight line. The fourth direction axis DR4 and the fifth direction axis DR5 may be orthogonal. In addition, the second direction axis DR2 and the fifth direction axis DR5 may extend in opposite directions on a straight line. The third direction axis DR3 may be perpendicular to a plane defined by the first direction axis DR1 and the second direction axis DR2. The display device DD may have a predetermined thickness in a direction parallel to the third direction axis DR3.

Figure 1B:
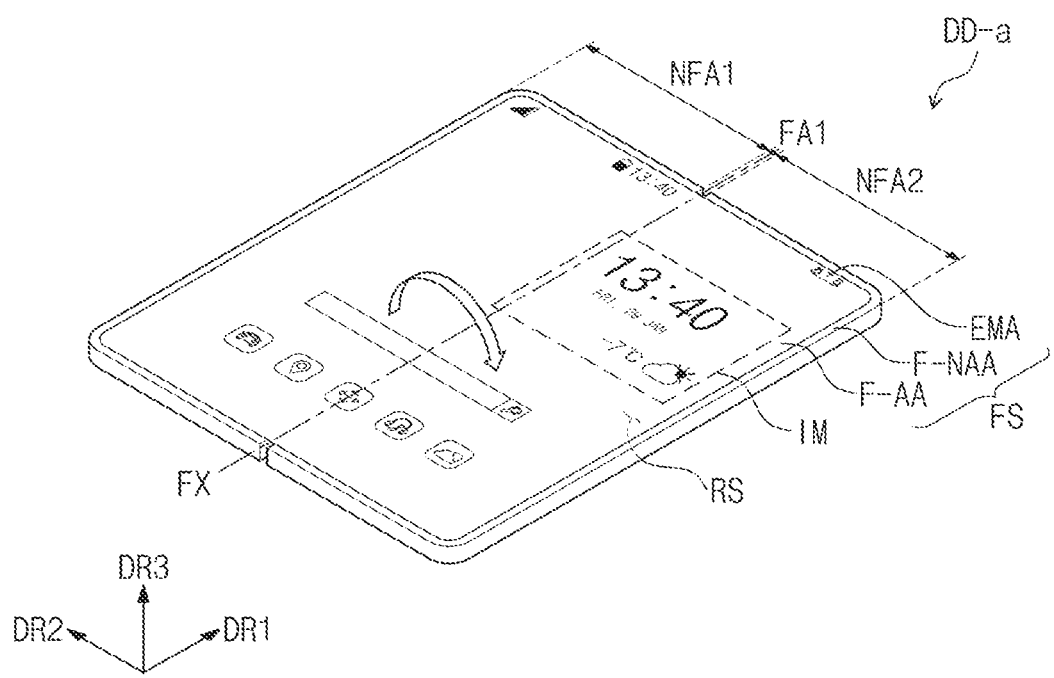
FIG. 1B is a perspective view of a display device according to an embodiment.
Figure 1C:
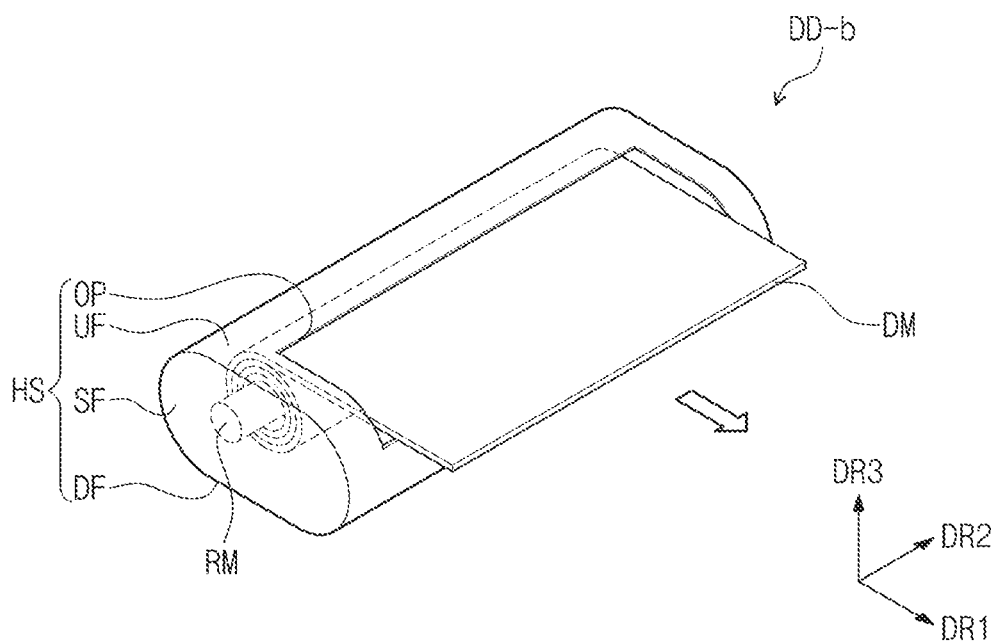
FIG. 1C is a perspective view of a display device according to an embodiment.

FIGS. 1B and 1C are perspective views illustrating display devices DD-a and DD-b according to other embodiments of the inventive concept. The display device DD-a of FIG. 1B may be a foldable display device. The display device DD-b of FIG. 1C may be a rollable display device.

Referring to FIG. 1B, the display device DD-a may include a folding region FA1 and non-folding regions NFA1 and NFA2 adjacent to the folding region FA1. A first non-folding region NFA1 and a second non-folding region NFA2 may be spaced apart with the folding region FA1 interposed therebetween. FIG. 1B illustrates that the display device DD-a includes one folding region FA1 and two non-folding regions NFA1 and NFA2, but the number of folding regions and the number of non-folding regions are not limited thereto.

The first non-folding region NFA1 and the second non-folding region NFA2 may be spaced apart in a direction parallel to the second direction axis DR2. The display device DD-a may be folded with respect to the folding axis FX which is a virtual line extending in a direction parallel to the first direction axis DR1. The folding axis FX may be parallel to the long side of the display device DD-a. However, an embodiment of the inventive concept is not limited thereto, the folding axis FX may be parallel to the short side of the display device DD-a. In addition, although FIG. 1B illustrates one folding axis FX, the number of folding axes FX may be two or more. When the display device DD-a is folded, the non-folding regions NFA1 and NFA2 may face each other.

The display device DD-a may include a first display surface FS and a second display surface RS. The first display surface FS may include an active region F-AA and a peripheral region F-NAA adjacent to the active region F-AA. The peripheral region F-NAA may surround the active region F-AA. Unlike the configuration illustrated, at least a part of the peripheral region F-NAA in the display device DD-a may be omitted. The second display surface RS may face at least a portion of the first display surface FS. The second display surface RS may be a part of the rear surface of the display device DD-a. FIG. 1B illustrates that the second display surface RS is exposed to the outside when the display device DD-a is folded. However, an embodiment of the inventive concept is not limited thereto, and the first display surface FS may be exposed when the display device DD-a is folded.

An image IM may be displayed in the active region F-AA. The active region may include a module region EMA. An electronic module may be disposed in the module region EMA. For example, the electronic module may include any one among a camera, a light detection sensor, and a heat detection sensor.

Referring to FIG. 1C, the display device DD-b may include a display module DM, a housing HS, and at least one roller RM. The housing HS may include a lower frame DF, an upper frame UF facing the lower frame DF, and a side frame SF connecting the lower frame DF and the upper frame UF. The roller RM may be accommodated in the housing HS. The lower frame DF may be parallel to a plane defined by the first direction axis DR1 and the second direction axis DR2. An opening OP may be defined in the upper frame UF. The display module DM may be drawn in and out through the opening OP. One end of the display module DM may be attached to the roller RM. As the roller RM rotates, the display module DM may be wound.

Figure 2:
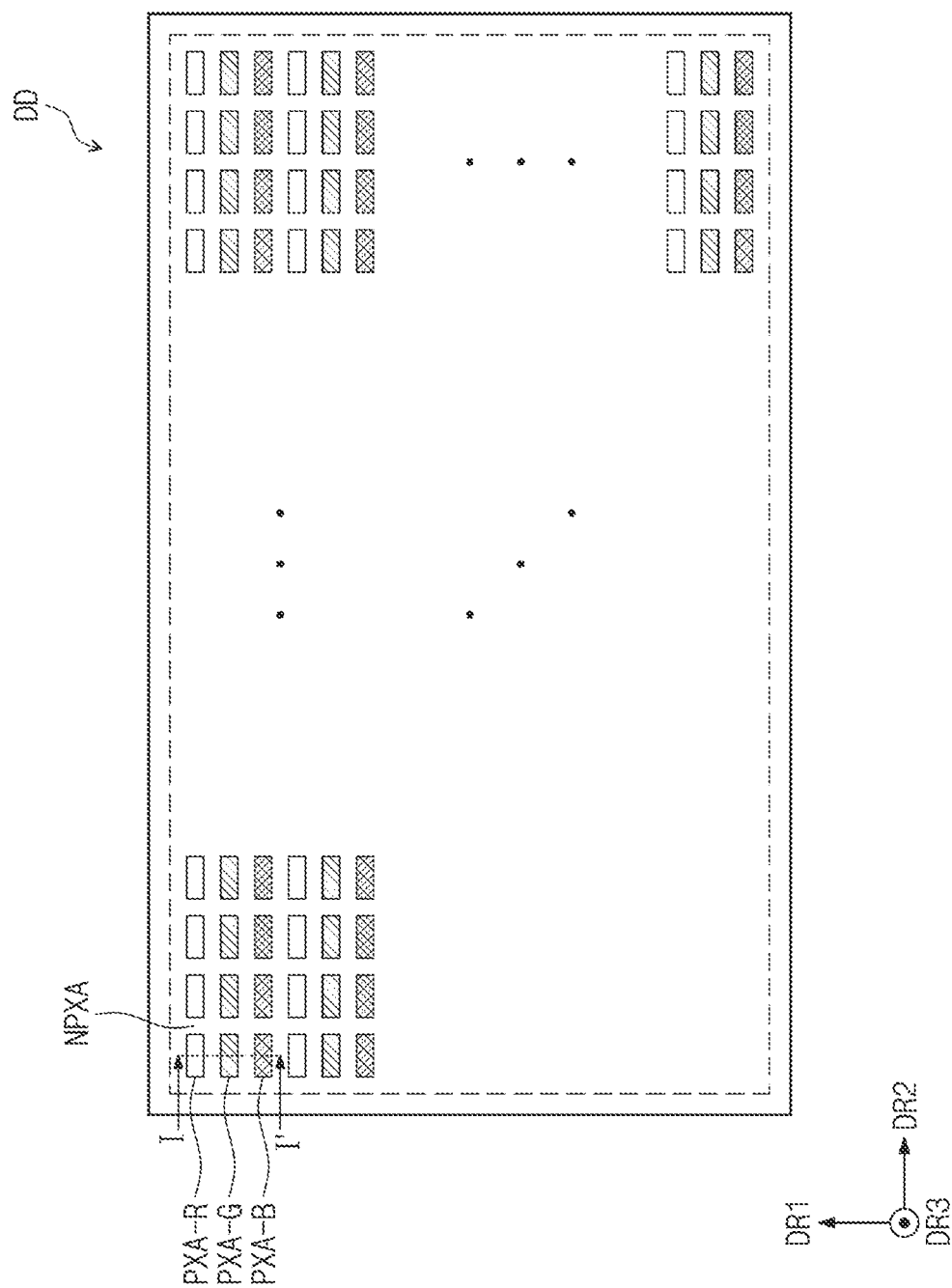
FIG. 2 is a plan view illustrating a part of a display device according to an embodiment.
Figure 3:
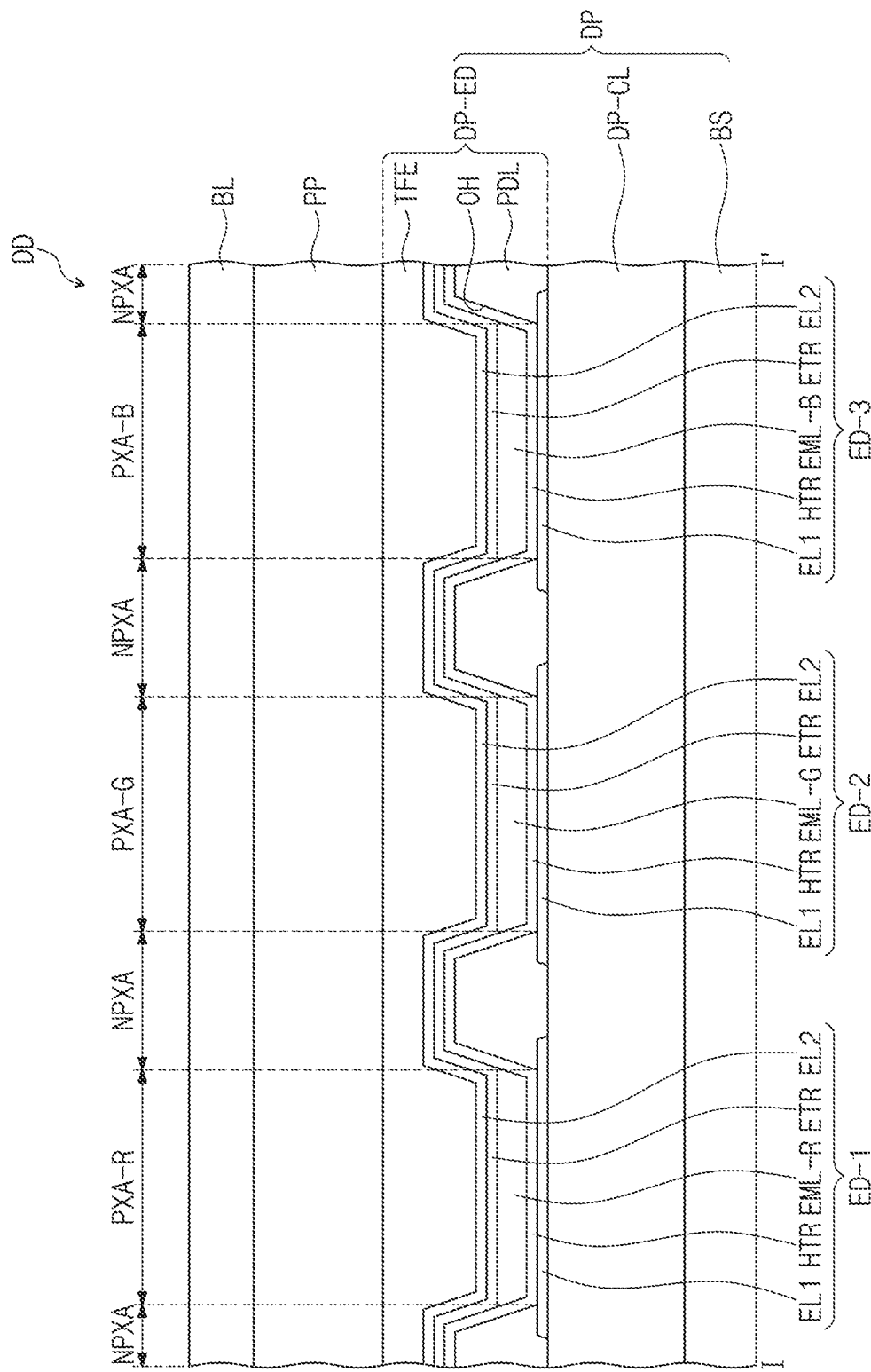
FIG. 3 is a cross-sectional view illustrating a display device according to an embodiment.

FIG. 2 is a plan view illustrating a part of a display device DD according to an embodiment. FIG. 3 is a cross-sectional view illustrating a display device DD according to an embodiment, and taken along line I-I' of FIG. 2. A description of the display device DD of FIG. 3 may be similarly applied to the display device DD-a of FIG. 1B and the display device DD-b of FIG. 1C. In addition, descriptions of the display device DD-a of FIG. 1B and the display device DD-b of FIG. 1C may be similarly applied to the display device DD of FIG. 3. The display device DD of FIG. 3 may extend in a direction parallel to at least one directional axis. The display device DD of FIG. 3 may be deformable and may be flexible.

The display device DD may include a display panel DP and an optical layer PP disposed on the display panel DP. The display panel DP includes light-emitting elements ED-1, ED-2, and ED-3. The display device may include a plurality of light-emitting elements ED-1, ED-2, and ED-3. The optical layer PP may be disposed on the display panel DP to control reflected light from the display panel DP by external light. For example, the optical layer PP may include a polarizing layer or a color filter layer. Meanwhile, unlike the configuration illustrated in the drawings, the optical layer PP may be omitted in the display device DD according to an embodiment.

A base substrate BL may be disposed on the optical layer PP. The base substrate BL may be a member that provides a base surface on which the optical layer PP is disposed. The base substrate BL may be a glass substrate, a metal substrate, a plastic substrate, or the like. However, an embodiment of the inventive concept is not limited thereto, and the base substrate BL may be an inorganic layer, an organic layer, or a composite material layer. In addition, unlike the configuration illustrated, in an embodiment, the base substrate BL may be omitted.

The display device DD according to an embodiment may further include a filling layer (not shown). The filling layer (not shown) may be disposed between the display element layer DP-ED and the base substrate BL. The filling layer (not shown) may be an organic material layer. The filling layer (not shown) may include at least one of an acrylic resin, a silicone-based resin, or an epoxy-based resin.

The display panel DP may include a base layer BS, a circuit layer DP-CL provided on the base layer BS, and a display element layer DP-ED. The display element layer DP-ED includes a pixel defining layer PDL, the light-emitting elements ED-1, ED-2, and ED-3 disposed between the pixel defining layer PDL, and an encapsulation layer TFE disposed on the light-emitting elements ED-1, ED-2, and ED-3.

The base layer BS may be a member that provides a base surface on which the display element layer DP-ED is disposed. The base layer BS may be a glass substrate, a metal substrate, a plastic substrate, and the like. However, an embodiment of the inventive concept is not limited thereto, and the base layer BS may be an inorganic layer, an organic layer, or a composite material layer.

In an embodiment, the circuit layer DP-CL may be disposed on the base layer BS, and the circuit layer DP-CL may include a plurality of transistors (not shown). The transistors (not shown) may each include a control electrode, an input electrode, and an output electrode. For example, the circuit layer DP-CL may include a switching transistor and a driving transistor for driving the light-emitting elements ED-1, ED-2, and ED-3 of the display element layer DP-ED.

Each of the light-emitting elements ED-1, ED-2, and ED-3 may have a structure of a light-emitting element ED according to an embodiment of FIGS. 4 to 7 to be described later. Each of the light-emitting elements ED-1, ED-2, and ED-3 may include a first electrode EL1, a hole transport region HTR, light-emitting layers EML-R, EML-G, and EML-B, an electron transport region ETR, and a second electrode EL2.

FIG. 3 illustrates an embodiment in which the light-emitting layers EML-R, EML-G, and EML-B of the light-emitting elements ED-1, ED-2, and ED-3 are disposed in the opening OH defined in the pixel defining layer PDL, and the hole transport region HTR, the electron transport region ETR, and the second electrode EL2 are provided as common layers in all of the light-emitting elements ED-1, ED-2, ED-3. However, the embodiment of the inventive concept is not limited thereto, unlike the configuration illustrated in FIG. 3, in an embodiment, the hole transport region HTR and the electron transport region ETR may be provided by being patterned inside the opening OH defined in the pixel defining layer PDL. For example, in an embodiment, the hole transport region HTR, the light-emitting layers EML-R, EML-G, and EML-B, and the electron transport region ETR of the light-emitting elements ED-1, ED-2, and ED-3 may be provided by being patterned through an inkjet printing method.

The encapsulation layer TFE may cover the light-emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a stack of a plurality of layers. The encapsulation layer TFE includes at least one insulating layer. The encapsulation layer TFE according to an embodiment may include at least one inorganic film (hereinafter, an encapsulation inorganic film). In addition, the encapsulation layer TFE according to an embodiment may include at least one organic film (hereinafter, an encapsulation organic film) and at least one encapsulation inorganic film.

The encapsulation inorganic film protects the display element layer DP-ED from moisture/oxygen, and the encapsulation organic film protects the display device layer DP-ED from foreign substances such as dust particles. The encapsulation inorganic film may include silicon nitride, silicon oxy nitride, silicon oxide, titanium oxide, aluminum oxide, or the like, but is not particularly limited thereto. The encapsulation organic film may include an acrylic compound, an epoxy-based compound, and the like. The encapsulation organic film may include a photopolymerizable organic material but is not particularly limited.

The encapsulation layer TFE may be disposed on the second electrode EL2, and fill the opening OH.

Referring to FIGS. 2 and 3, the display device DD may include a non-light-emitting region NPXA and light-emitting regions PXA-R, PXA-G, and PXA-B. The light-emitting regions PXA-R, PXA-G, and PXA-B may be regions in which light generated by the respective light-emitting elements ED-1, ED-2, and ED-3 is emitted. The light-emitting regions PXA-R, PXA-G, and PXA-B may be spaced apart from each other on a plane.

Each of the light-emitting regions PXA-R, PXA-G, and PXA-B may be divided by the pixel defining layer PDL. The non-light-emitting regions NPXA may be located between the adjacent light-emitting regions PXA-B, PXA-G, and PXA-R and correspond to the pixel defining layer PDL. Meanwhile, in the present specification, the light-emitting regions PXA-B, PXA-G, and PXA-R may respectively correspond to pixels. The pixel defining layer PDL may divide the light-emitting elements ED-1, ED-2, and ED-3. The light-emitting layers EML-R, EML-G, EML-B of the light-emitting elements ED-1, ED-2, and ED-3 may be disposed and divided in the opening OH defined in the pixel defining layer PDL.

The light-emitting regions PXA-B, PXA-G, and PXA-R may be divided into a plurality of groups according to the color of light generated from the light-emitting elements ED-1, ED-2, and ED-3. In the display device DD of an embodiment illustrated in FIGS. 2 and 3, three light-emitting regions PXA-R, PXA-G, and PXA-B respectively emitting red light, green light, and blue light are exemplarily illustrated. For example, the display device DD according to an embodiment may include a red light-emitting region PXA-R, a green light-emitting region PXA-G, and a blue light-emitting region PXA-B that are distinguished from each other.

In the display device DD according to an embodiment, the plurality of light-emitting elements ED-1, ED-2, and ED-3 may emit light of different wavelength ranges. For example, in an embodiment, the display device DD may include a first light-emitting element ED-1 for emitting red light, a second light-emitting element ED-2 for emitting green light, and a third light-emitting element ED-3 for emitting blue light. That is, the red light-emitting region PXA-R, green light-emitting region PXA-G, and blue light-emitting region PXA-B of the display device may respectively correspond to the first light-emitting element ED-1, the second light-emitting element ED-2, and the third light-emitting element ED-3.

However, an embodiment of the inventive concept is not limited thereto, and the first to third light-emitting elements ED-1, ED-2, and ED-3 may emit light of the same wavelength range or at least one of the first to third light-emitting elements ED-1, ED-2, or ED-3 may emit light of a different wavelength range. For example, all of the first to third light-emitting elements ED-1, ED-2, and ED-3 may emit blue light.

The light-emitting regions PXA-R, PXA-G, and PXA-B in the display device DD according to an embodiment may be arranged in a stripe shape. Referring to FIG. 2, a plurality of red light-emitting regions PXA-R, a plurality of green light-emitting regions PXA-G, and a plurality of blue light-emitting regions PXA-B are each aligned along the second direction axis DR2. In addition, the light-emitting regions may be alternately arranged in the order of the red light-emitting region PXA-R, the green light-emitting region PXA-G, and the blue light-emitting region PXA-B along the first direction axis DR1.

FIGS. 2 and 3 illustrate that areas of the light-emitting regions PXA-R, PXA-G, and PXA-B are all similar, but an embodiment of the inventive concept is not limited thereto. Thus, the areas of the light-emitting regions PXA-R, PXA-G, and PXA-B may be different from each other according to the wavelength range of the emitted light. Meanwhile, the areas of the light-emitting regions PXA-R, PXA-G, and PXA-B may mean an area as viewed on a plane defined by the first direction axis DR1 and the second direction axis DR2.

Meanwhile, an arrangement form of the light-emitting pixel regions PXA-R, PXA-G, and PXA-B is not limited to that illustrated in FIG. 2, and an order in which the red light-emitting region PXA-R, the green light-emitting region PXA-G, and the blue light-emitting region PXA-B are arranged may be provided in various combinations according to the characteristics of display quality required by the display device DD. For example, the arrangement form of the light-emitting regions PXA-R, PXA-G, and PXA-B may be a pentile arrangement or a diamond arrangement.

In addition, the areas of the light-emitting regions PXA-R, PXA-G, and PXA-B may be different from each other. For example, in an embodiment, the area of the green light-emitting region PXA-G may be smaller than the area of the blue light-emitting region PXA-B, but an embodiment of the inventive concept is not limited thereto.

Hereinafter, FIGS. 4 to 7 are cross-sectional schematic representations illustrating a light-emitting element according to an embodiment. The light-emitting element ED may include the first electrode EL1, the hole transport region HTR, the light-emitting layer EML, the electron transport region ETR, and the second electrode EL2 sequentially stacked.

Figure 4:
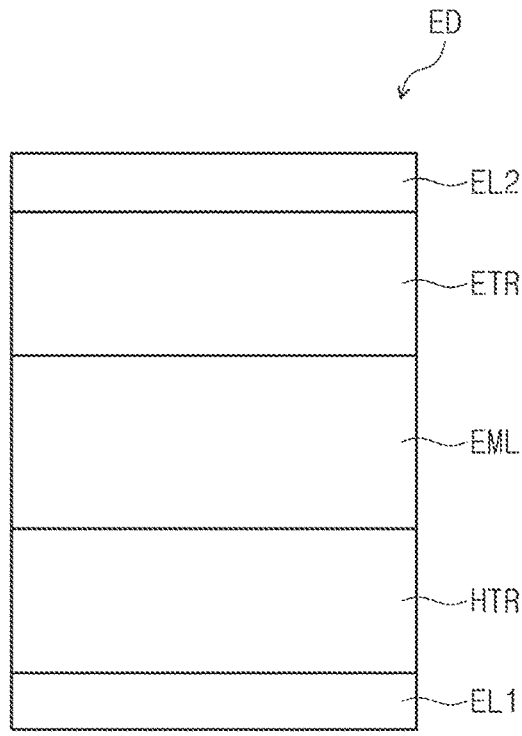
FIG. 4 is a cross-sectional schematic representation illustrating a light-emitting element according to an embodiment.
Figure 5:
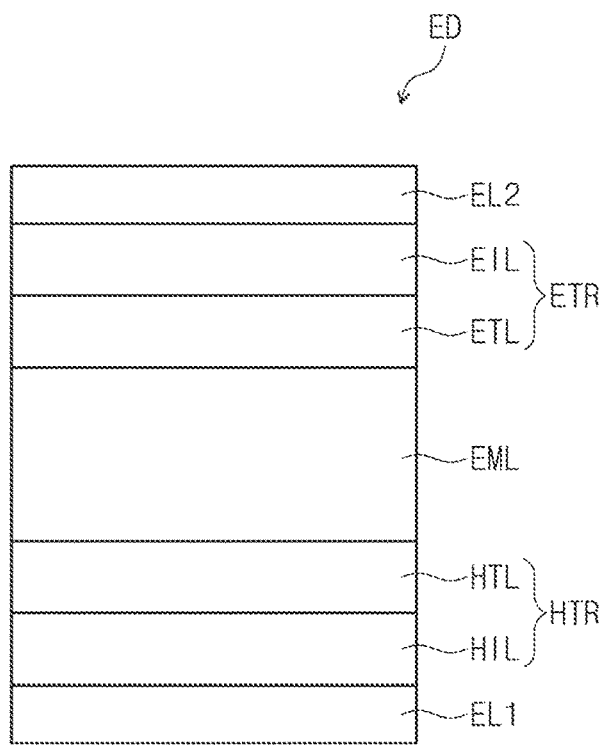
FIG. 5 is a cross-sectional schematic representation illustrating a light-emitting element according to an embodiment.
Figure 6:
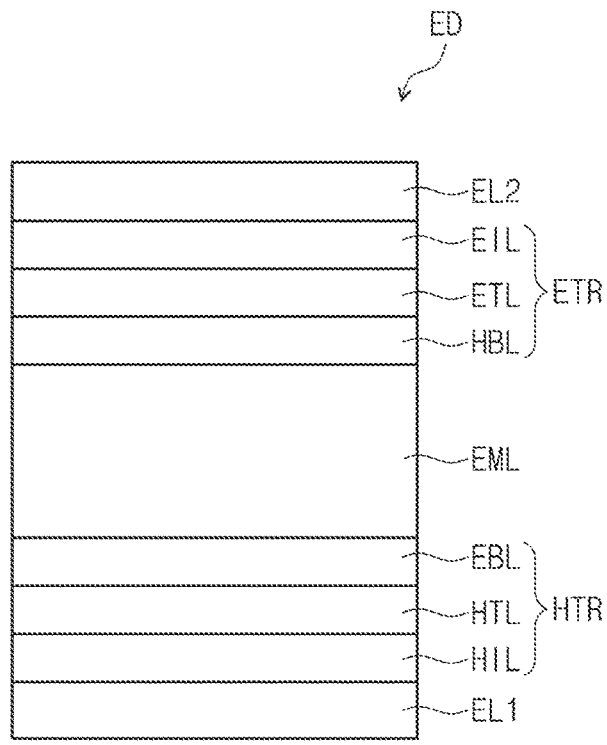
FIG. 6 is a cross-sectional schematic representation illustrating a light-emitting element according to an embodiment.
Figure 7:
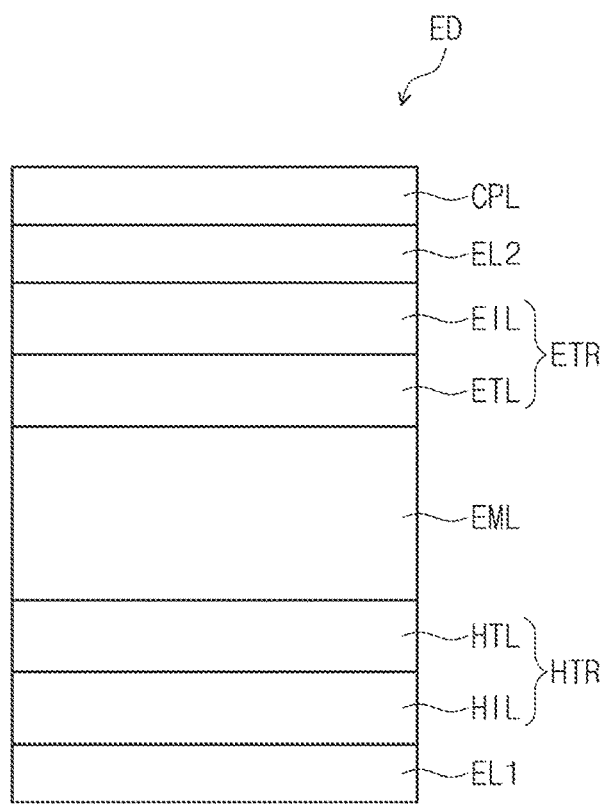
FIG. 7 is a cross-sectional schematic representation illustrating a light-emitting element according to an embodiment.

FIG. 5 is a cross-sectional schematic representation of a light-emitting element ED according to an embodiment in which the hole transport region HTR includes a hole injection layer HIL and a hole transport layer HTL and the electron transport region ETR include an electron injection layer EIL and an electron transport layer ETL, as compared to FIG. 4. In addition, FIG. 6 is a cross-sectional view of a light-emitting element ED according to an embodiment in which the hole transport region HTR includes a hole injection layer HIL, a hole transport layer HTL, and an electron blocking layer, and the electron transport region ETR include an electron injection layer EIL, an electron transport layer ETL, and a hole blocking layer HBL, as compared to FIG. 4. FIG. 7 is a cross-sectional view of a light-emitting element ED according to an embodiment including a capping layer CPL disposed on the second electrode EL2, as compared to FIG. 5.

The first electrode EL1 has a conductivity. The first electrode EL1 may be formed of a metal material, a metal alloy, or a conductive compound. The first electrode EL1 may be a positive electrode or a negative electrode. However, an embodiment of the inventive concept is not limited thereto. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, and W or a compound or mixture thereof (e.g., a mixture of Ag and Mg). In addition, the first electrode EL1 may have a multilayer structure including a reflective film or semi-transmissive film formed of the above-described material, and a transparent conductive film formed of indium tin oxide (ITO), indium zinc oxide (IZO), zinc oxide (ZnO), indium tin zinc oxide (ITZO), and the like. For example, the first electrode EL1 may have a three-layer structure of ITO/Ag/ITO, but is not limited thereto. In addition, an embodiment of the inventive concept is not limited thereto, and the first electrode EL1 may include the above-described metal material, a combination of two or more kinds of metal materials selected from among the above metal materials, or oxides of the above-described metal material, and the like. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include a charge transport compound of an embodiment.

The term "substituted" in the present specification refers to substitution of a hydrogen of an organic moiety with at least one of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkyl group of 1 to 8 carbons, an alkenyl group of 2 to 8 carbons, an alkynyl group of 2 to 8 carbons, an alkoxy group of 1 to 8 carbons, a hydrocarbon ring group of 5 to 8 carbons, an aryl group of 6 to 10 carbons, and a heterocyclic group of 3 to 10 carbons.

The term "substituted" in the present specification refers to a substitution of one or more hydrogens of an organic structural group with at least one of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkyl group of 1 to 8 carbons, an alkenyl group of 2 to 8 carbons, an alkynyl group of 2 to 8 carbons, an alkoxy group of 1 to 8 carbons, a hydrocarbon ring group of 5 to 8 carbons, an aryl group of 6 to 10 carbons, and a heterocyclic group of 3 to 10 carbons.

In the present specification, the term "bonding with an adjacent group to form a ring" may mean bonding with an adjacent group to form a substituted or unsubstituted hydrocarbon ring or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, a ring formed by mutually bonding may be connected to another ring to form a spiro structure.

In the present specification, the term "adjacent group" may mean a substituent substituted at an atom directly linked to an atom substituted with the corresponding substituent, another substituent substituted at an atom substituted with the corresponding substituent, or a substituent which is three-dimensionally closest to the corresponding substituent. For example, in 1,2-dimethylbenzene, two methyl groups may be interpreted as mutually "adjacent groups", and in 1,1-diethylcyclopentane, two ethyl groups may be interpreted as mutually "adjacent groups." In addition, in 4,5-dimethylphenanthrene, two methyl groups may be interpreted as mutually "adjacent groups.".

In the present specification, examples of a halogen atom include a fluorine atom, a chlorine atom, a bromine atom, or an iodine atom.

In the present specification, an alkyl group may be straight, branched, or cyclic. Examples of the alkyl group include a methyl group, an ethyl group, an n-propyl, group, a isopropyl group, an n-butyl group, a s-butyl group, a t-butyl group, an i-butyl group, an 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, an 2-ethylpentyl group, a 4-methyl-2-pentyl group, an n-hexyl group, a 1-methylhexyl group, an 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, an 2-ethylheptyl group, a 2-butylheptyl group, an n-octyl group, a t-octyl group, an 2-ethyloctyl group, a 2-butyloctyl group, an 2-hexyloctyl group a 3,7-dimethyloctyl group, a cyclooctyl group, an n-nonyl group, an n-decyl group, an adamantyl group, an 2-ethyldecyl group, a 2-butyldecyl group, a 2-hexyldecyl group, an 2-octyldecyl group, an n-undecyl group, an n-dodecyl group, an 2-ethyldodecyl group, a 2-butyldodecyl group, an 2-hexyldodecyl group, an 2-octyldodecyl group, an n-tridecyl group, an n-tetradecyl group, an n-pentadecyl group, an n-hexadecyl group, an 2-ethylhexadecyl group, a 2-butylhexadecyl group, an 2-hexylhexadecyl group, an 2-octylhexadecyl group, an n-heptadecyl group, an n-octadecyl group, an n-nonadecyl group, an n-icosyl group, an 2-ethylicosyl group, a 2-butylicosyl group, an 2-hexylicosyl group, an 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group and the like, but an embodiment of the inventive concept is not limited thereto.

In the present specification, an aryl group means any functional group or substituent derived from an aromatic hydrocarbon ring. The aryl group may be a monocyclic aryl group or a polycyclic aryl group. The number of ring carbon atoms in the aryl group may be about 6 to about 30, about 6 to about 20, or about 6 to about 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexyphenyl group, a triphenylenyl group, a pyrenyl group, a benzofluoranthenyl group, a chrysenyl group and the like, but an embodiment of the inventive concept is not limited thereto.

In the present specification, the heteroaryl group may include, as a hetero atom, at least one of B, O, N, P, Si, or S. When the heteroaryl group includes two or more hetero atoms, the two or more hetero atoms may be the same as or different from each other. The heteroaryl group may be a monocyclic heterocyclic group or a polycyclic heterocyclic group. The number of ring-forming carbon atoms in the heterocyclic group may be about 2 to about 30, about 2 to about 20, or about 2 to about 10. Examples of the heteroaryl group include a thiophene group, a furan group, a pyrrole group, a imidazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxy group, a phthalazine group, a pyrido pyrimidine group, a pyrido pyrazine group, a pyrazino pyrazine group, an isoquinoline group, an indole group, a carbazole group, an N-aryl carbazole group, an N-heteroaryl carbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilol group, a dibenzofuran group, and the like, but an embodiment of the inventive concept is not limited thereto.

In the present specification, an aromatic ring group includes an aryl group and a heteroaryl group, and the description of the above-described aryl group and heteroaryl group may be applied to the aromatic ring group.

In the present specification, a direct linkage may mean a single bond.

Meanwhile, in the present specification,

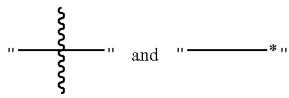

mean a connected position.

The charge transport material of an embodiment may be derived from an azide compound represented by Formula 1 and a polymer compound including an aromatic ring group.

Formula 1

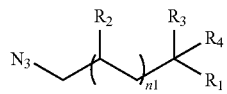

In formula 1, n1 may be an integer of 1 to 9. A hydrocarbon to which $N_3$ is bonded may be an unsubstituted straight-chain alkyl group, and the number of carbon atoms in the alkyl group may be 4 to 20. In addition, a hydrocarbon to which $N_3$ is bonded may include one or more of $R_1$ to $R_4$ as including a substituent, and the total number of carbon atoms in the alkyl group may be 4 to 24.

$R_1$ and $R_2$ may each independently be a hydrogen atom or an optionally substituted alkyl group having 1 to 10 carbon atoms. For example, when n1 is 1 and $R_1$ is a hydrogen atom, $R_2$ may be an ethyl group.

$R_3$ and $R_4$ may each independently be a hydrogen atom or an optionally substituted alkyl group having 1 to 9 carbon atoms. $R_2$ may be different from $R_3$ and $R_2$ may be different from $R_4$. For example, $R_3$ and $R_4$ may each be a methyl group, and $R_2$ may be a hydrogen atom. In addition, $R_1$ may be different from $R_3$, and $R_1$ may be different from $R_4$. $R_3$ and $R_4$ may each be a hydrogen atom, and $R_1$ may be an alkyl group.

The azide compound according to an embodiment may be one in which an azide group is bonded to an end of a hydrocarbon, i.e., a primary carbon. The azide compound may be represented by any one of the compounds of Compound Group 1.

Compound Group 1

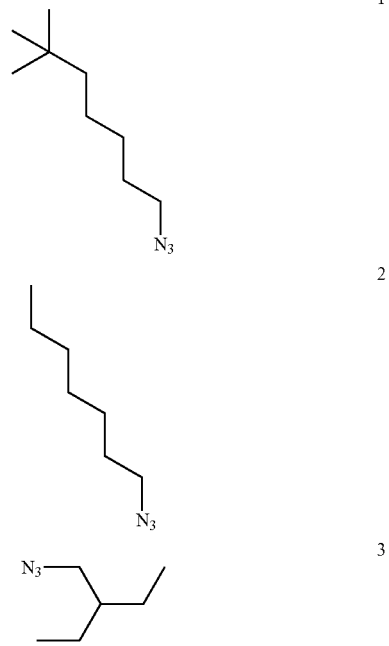

The azide compound according to an embodiment, $R_1$ and $R_2$ may each independently be a hydrogen atom or an unsubstituted alkyl group having 1 to 10 carbon atoms. For example, when n1 is 1 to 4, and $R_1$ is hydrogen or an unsubstituted alkyl group having 1 to 6 carbon atoms, $R_2$ may be hydrogen or an unsubstituted alkyl group having 1 to 6 carbon atoms.

The azide compound according to an embodiment, $R_3$ and $R_4$ may each independently be a hydrogen atom or an unsubstituted alkyl group having 1 to 6 carbon atoms. $R_2$ may be the same or different from $R_3$, and $R_2$ may be the same or different from $R_4$. For example, $R_3$ and $R_4$ may each independently be a methyl or ethyl group, and $R_2$ may be a hydrogen, methyl, or ethyl group. In addition, $R_1$ may be the same or different from $R_3$, and $R_1$ may be the same or different from $R_4$. For example, $R_3$ and $R_4$ may each be a hydrogen atom, and $R_1$ may be an alkyl group having 1 to 6 carbon atoms.

In an embodiment, the charge transport material may include a polymer compound containing an aromatic ring group. The molecular weight of the polymer compound may be about 10,000 grams per mole (g/mol) to about 1,000,000 g/mol. For example, the polymer compound may be a poly(triphenylamine), poly(9,9-dioctylfluorene-alt-N-(4-sec-butylphenyl)-diphenyl amine), poly(p-phenylenevinylene), polythiophenes, poly(p-phenylene), polyfluorenes, or a cyano-polyphenylene vinylene. In addition, the polymer compound may be a polyvinylcarbazole represented by Formula 4.

Formula 4

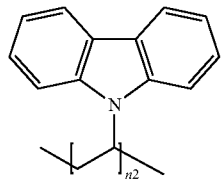

In Formula 4, n2 may be an integer of 100 to 300. The number average molecular weight of the polyvinylcarbazole represented by Formula 4 may be about 25,000 g/mol to about 50,000 g/mol.

In the charge transport material, a mole ratio of the moles of the azide compound to the moles of the polymer compound may be about 1:1.85 to about 1:3.0, about 1:2.0 to about 1:2.8, or about 1:2.1 to about 1:2.5. In the charge transport material, the mole percent of the azide compound may be about 25 mol % to about 35 mol %, and the mole percent of the polymer compound may be about 65 mol % to about 75 mol %. For example, the mole ratio of the moles of the azide compound to the moles of the polymer compound in the charge transport material may be about 1:2.33. In the charge transport compound, the mole percent of the azide compound may be about 30 mol %, and the mole percent of the polymer compound may be about 70 mol %.

Figure 8:
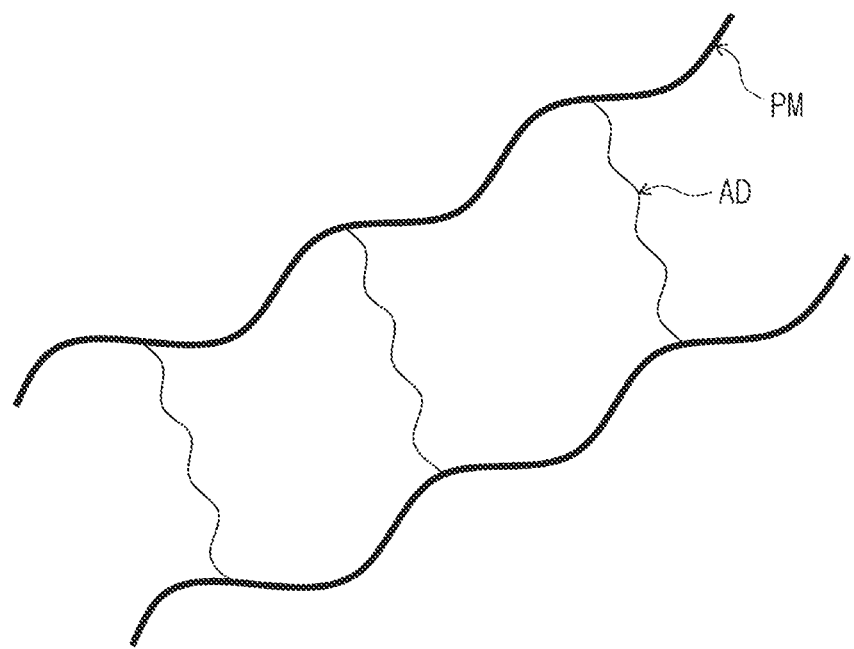
FIG. 8 schematically illustrates a crosslinked charge transport material according to an embodiment.

The charge transport material may be formed by crosslinking a polymer compound PM with an azide compound AD. FIG. 8 schematically illustrates that the polymer compound PM is crosslinked by the azide compound AD. A carbon atom of the azide compound AD may be bonded to the polymer compound PM. The azide compound AD is a crosslinking agent and may include a hydrocarbon chain and an azide group bonded to the end of the hydrocarbon chain. A hole transport region HTR including the charge transport material derived from the polymer compound PM and the azide compound AD may have improved flexibility. The display devices DD, DD-a, and DD-b including the hole transport region HTR including the charge transport material according to embodiments may exhibit improved flexibility.

Figure 9:
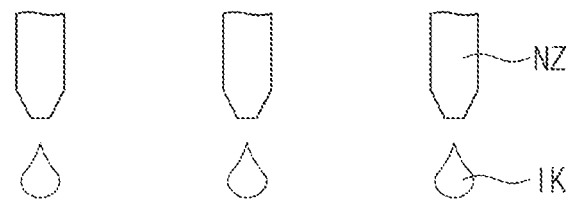
FIG. 9 is a diagram schematically illustrating a method of manufacturing a light-emitting element.
Figure 10:
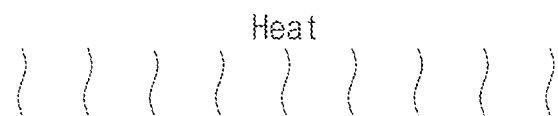
FIG. 10 is a diagram schematically illustrating a method of manufacturing a light-emitting element.
Figure 10:
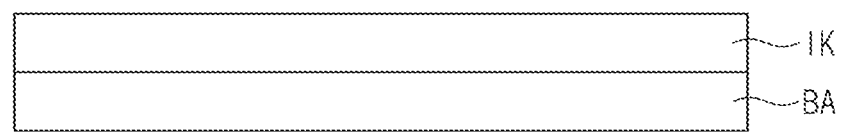

FIGS. 9 and 10 schematically illustrate forming the hole transport region HTR from a mixture IK of the azide compound AD and the polymer compound PM according to an embodiment. For example, FIGS. 9 and 10 may illustrate forming at least one of a hole injection layer HIL or a hole transport layer HTL of the hole transport region HTR. In addition, FIGS. 9 and 10 may illustrate forming at least one of a light-emitting layer EML, an electron injection layer EIL, or an electron transport layer ETL.

Referring to FIG. 9, the mixture IK may be provided through a nozzle NZ. The mixture IK may include an azide compound AD and a polymer compound PM mixed in a mole ratio of about 1:1.85 to about 1:3.0, respectively. The mixture IK may include about 25 mol % to about 35 mol % of the azide compound AD and about 65 mol % to about 75 mol % of the polymer compound PM. The mixture IK may include about 30 mol % of the azide compound AD and about 70 mol % of the polymer compound PM.

The mixture IK may be provided on a base portion BA. The base portion BA may include at least one of the first electrode EL1, the hole transport region HTR, the light-emitting layer EML, or the electron transport region ETR. For example, when the hole transport region HTR is formed from the mixture IK, the base portion BA may be the first electrode EL1 When the light-emitting layer EML is formed from the mixture IK, the base portion BA may include the first electrode EL1 and the hole transport region HTR disposed on the first electrode EL1. When the electron transport region ETR is formed from the mixture IK, the base portion BA may include the first electrode EL1, the hole transport region HTR disposed on the first electrode EL1, and the light-emitting layer EML disposed on the hole transport region HTR.

Referring to FIG. 10, the mixture IK may be cured by heat. Alternatively, the mixture IK may be cured by ultraviolet rays. After the mixture IK is provided on the base portion BA, heat or ultraviolet rays may be provided to form the hole transport region HTR, the light-emitting layer EML, or the electron transport region ETR. For example, as the mixture IK provided on the first electrode EL1 is cured, the hole transport region HTR may be formed. The mixture IK provided on the hole transport region HTR disposed on the first electrode EL1 may be cured to form the light-emitting layer EML. The mixture IK provided on the light-emitting layer EML disposed on the hole transport region HTR may be cured to form the electron transport region ETR.

The hole transport region HTR including the charge transport material may be formed through a wet process. In an embodiment, the mixture of the azide compound AD and the polymer compound PM may be provided by the wet process. The hole transport region HTR may be formed through the wet process such as a spin coating method, an inkjet printing method, a nozzle printing method, or a spray printing method. In addition, the charge transport material provided by the wet process may be cured by heat or ultraviolet rays to form the hole transport region HTR.

Meanwhile, in the light-emitting element ED of an embodiment, the hole transport region HTR may include at least one of the hole injection layer HIL, the hole transport layer HTL, a buffer layer or light-emitting auxiliary layer (not shown), or an electron blocking layer EBL. When the hole transport region HTR includes at least one of the hole injection layer HIL or the hole transport layer HTL, the hole injection layer HIL or the hole transport layer HTL may be formed from the charge transport material of an embodiment.

For example, the thickness of the hole transport region HTR may be about 50 angstroms (Å) to about 15,000 Å. The hole transport region HTR may have a single layer formed of a single material, a single layer formed of a plurality of different materials, or a multilayer structure having a plurality of layers formed of a plurality of different materials.

For example, the hole transport region HTR may have a single layer structure of the hole injection layer HIL or hole transport layer HTL, or may have a single layer structure formed of a hole injection material and a hole transport material. In addition, the hole transport region HTR may have a structure of a single layer formed of a plurality of different materials, or may have a structure such as a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown) or hole injection layer HIL/hole transport layer HTL/electron blocking layer (not shown) which are sequentially stacked from the first electrode EL1, but an embodiment of the inventive concept is not limited thereto.

In addition, the hole transport region HTR may be formed using various methods such as a vacuum evaporation method, a spin coating method, a cast method, a Langmuir-Blodgett (LB) method, an inkjet printing method, a laser printing method, and a laser induced thermal imaging (LITI).

The hole transport region HTR may further include below-described compounds in addition to the charge transport material of an embodiment.

The hole transport region HTR may include a compound represented by Formula H-1.

Formula H-1

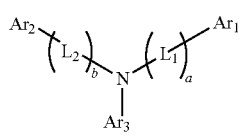

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. Meanwhile, when a or b is an integer of 2 or more, a plurality of $L_1$ and $L_2$ may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ are each independently be a substituted or unsubstituted aryl group having 6 to 30 ring-forming carbon atoms or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 may be a monoamine compound. Alternatively, the compound represented by Formula H-1 may be a diamine compound in which at least one of $Ar_1$, $Ar_2$, or $Ar_3$ includes an amine group as a substituent. In addition, the compound represented by Formula H-1 may be a carbazole-based compound containing a substituted or unsubstituted carbazole group in at least one of $Ar_1$ or $Ar_2$, or a fluorene-based compound containing a substituted or unsubstituted fluorene group in at least one of $Ar_1$ or $Ar_2$.

The compound represented by Formula H-1 may be represented by any one of compounds of Compound Group H below. However, the compounds listed in Compound Group H below are exemplarily illustrated, and the compound represented by the Formula H-1 is not limited to the one illustrated in Compound Group H below.

Compound Group H

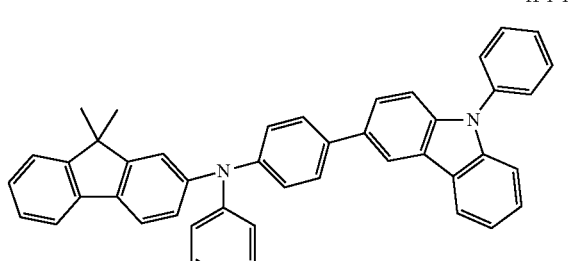
H-1-1

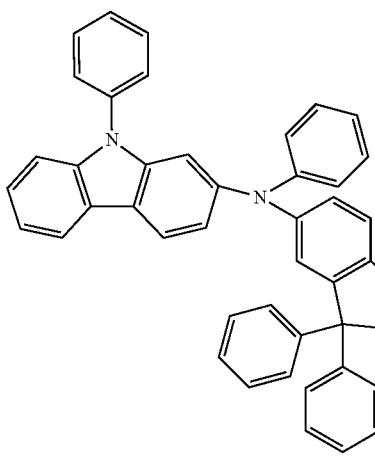
H-1-2

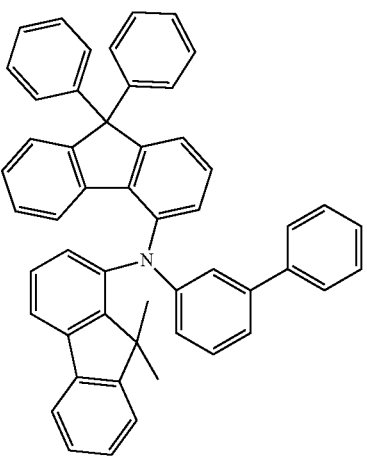
H-1-3

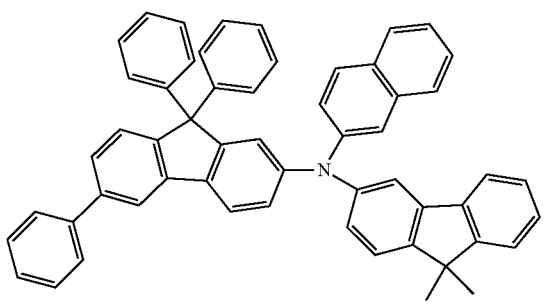
H-1-4

H-1-5
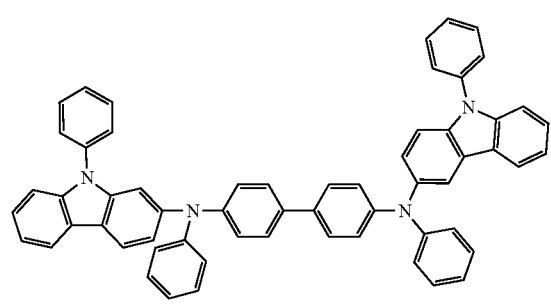
H-1-6
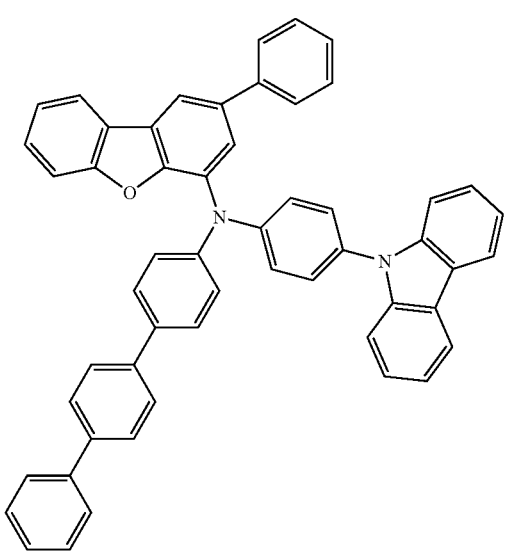
H-1-7
H-1-8
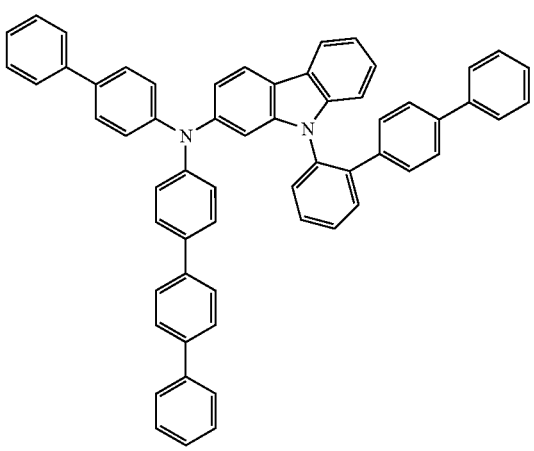
H-1-9
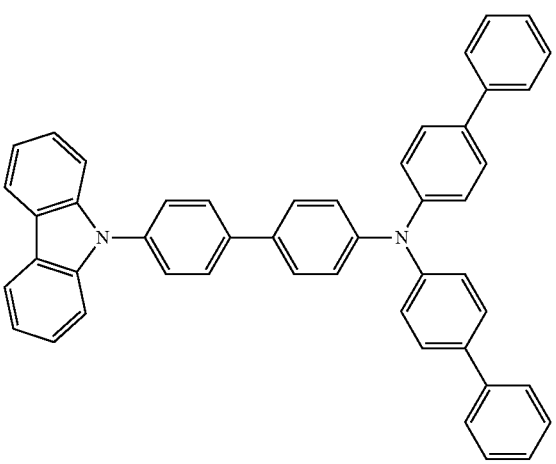
H-1-10
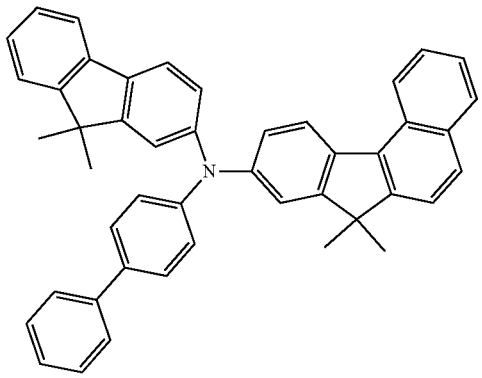

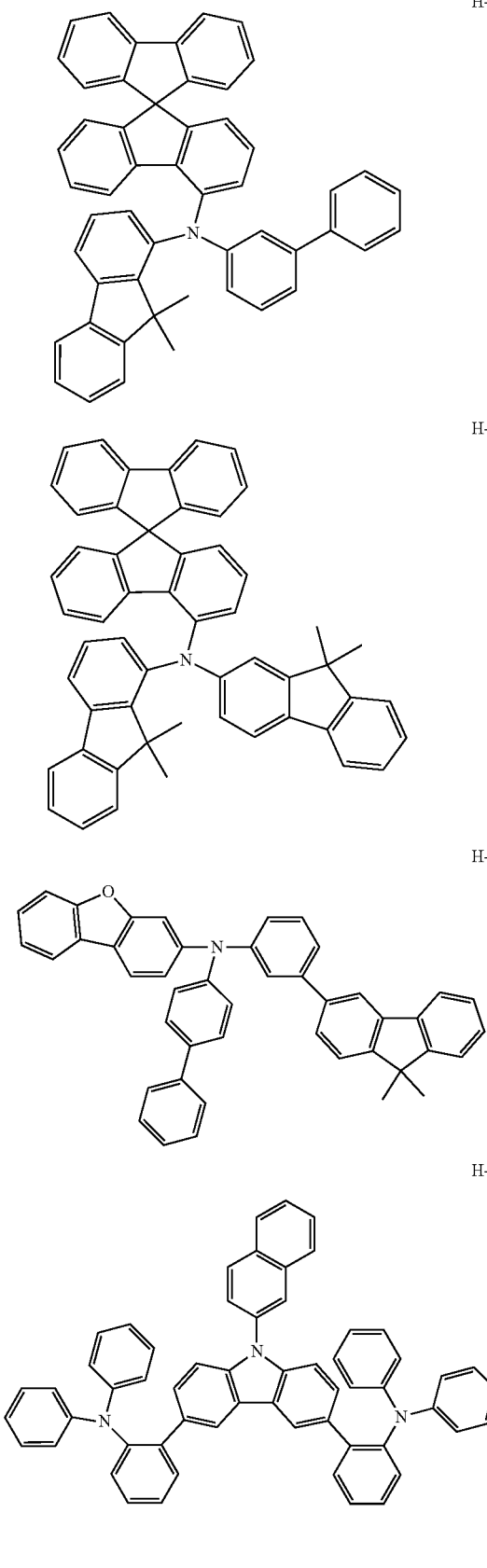
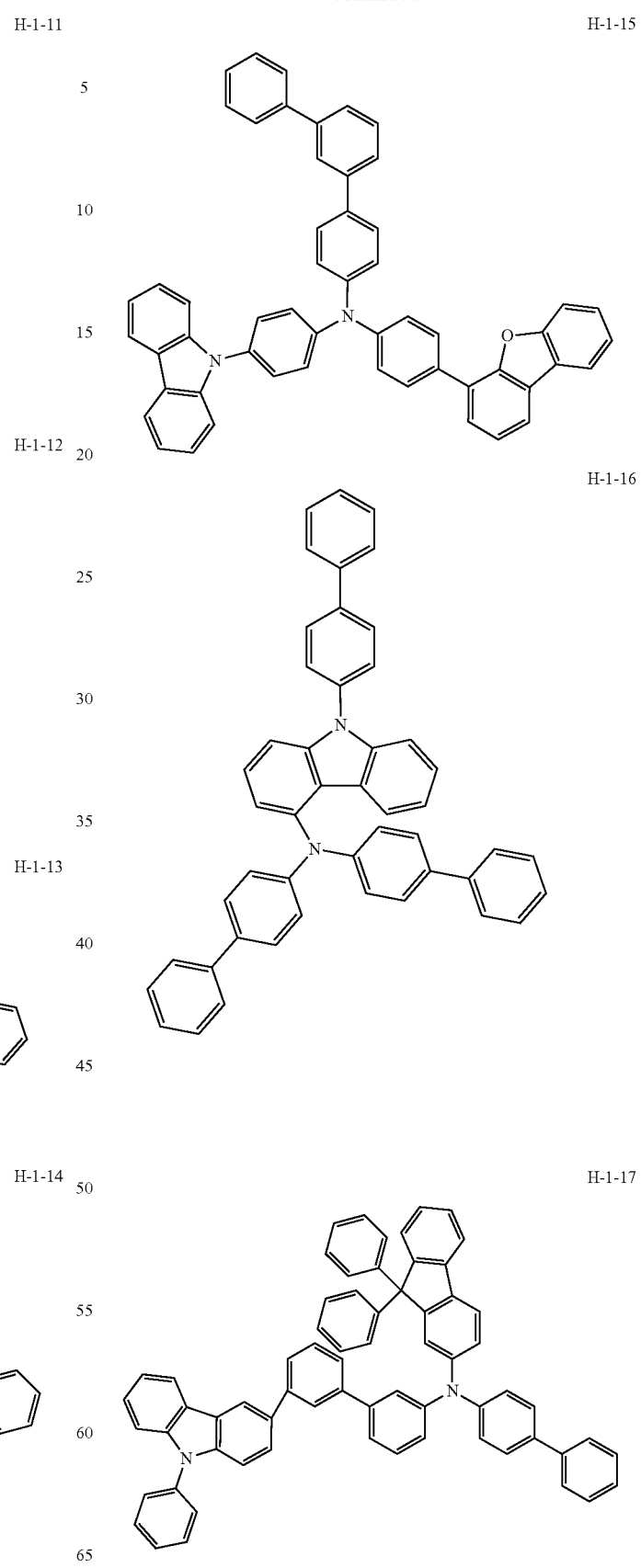

H-1-18

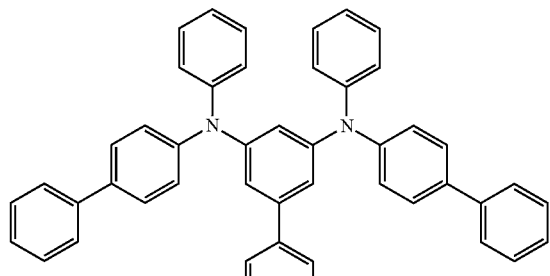

H-1-19

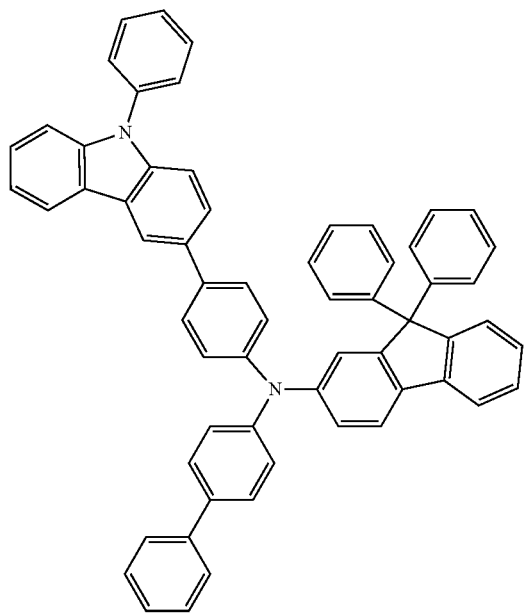

The hole transport layer HTR may include a phthalocyanine compound such as copper phthalocyanine, N1,N1'-([1,1'-biphenyl]-4,4'-diyl)bis(N1-phenyl-N4,N4-di-m-tolylbenzene-1,4-diamine (DNTPD), 4,4',4"-[tris(3-methylphenyl)phenylamino] triphenylamine (m-MTDATA), 4,4'4"'-Tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), (polyaniline/poly(4-styrenesulfonate)) (PANI/PSS), N,N'-di(naphthalene-1-yl)-N,N'-diphenyl-benzidine (NPB), polyetherketone containing triphenylamine (TPAPEK), 4-isopropyl-4'-methyldiphenyliodonium [tetrakis(pentafluorophenyl)borate], dipyrazino[2,3-f: 2',3'-h] quinoxaline-2,3,6,7,10,11-hexacarbonitrile (HATCN), and the like.

In addition, the hole transport region HTR may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), or 1,3-bis(1,8-dimethyl-9H-carbazol-9-yl)benzene (mDCP), and the like.

The hole transport region HTR may include the above-described compounds of the hole transport region in at least one of the hole injection layer HIL, the hole transport layer HTL, or an electron blocking layer EBL.

The thickness of the hole transport region HTR may be about 100 Å to about 10000 Å, for example, about 100 Å to about 5000 Å. When the hole transport region HTR includes the hole injection layer HIL, the thickness of the hole injection layer HIL may be, for example, about 30 Å to about 1000 Å. When the hole transport region HTR includes the hole transport layer HTL, the thickness of the hole transport layer HTL may be about 30 Å to about 1000 Å. For example, when the hole transport region HTR includes the electron blocking layer EBL, the thickness of the electron blocking layer EBL may be about 10 Å to about 1000 Å. When the thicknesses of the hole transport region HTR, the hole injection layer HIL, the hole transport layer HTL, and the electron blocking layer EBL satisfy the above-described ranges, satisfactory hole transport characteristics may be obtained without a substantial increase in driving voltage.

In addition to the aforementioned materials, the hole transport region HTR may further include a charge generating material to improve conductivity. The charge generating material may be uniformly or non-uniformly dispersed. For example, the charge generating material may be a p-dopant. The p-dopant may include at least one of a metal halide compound, a quinone derivative, a metal oxide or a compound containing a cyano group, but an embodiment of the inventive concept is not limited thereto. For example, the p-dopant may include a metal halide compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as tungsten oxide and molybdenum oxide, and a cyano group-containing compound such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), but an embodiment of the inventive concept is not limited thereto.

As described above, the hole transport region HTR may further include at least one of a buffer layer (not shown) or an electron blocking layer EBL in addition to the hole injection layer HIL and the hole transport layer HTL. The buffer layer (not shown) may increase luminous efficiency by compensating for a resonance distance according to the wavelength of light emitted from the light-emitting layer EML. A material that may be included in the hole transport region HTR may be used as a material included in the buffer layer (not shown). The electron blocking layer EBL is a layer that prevents injection of electrons from the electron transport region ETR to the hole transport region HTR.

The light-emitting layer EML is provided on the hole transport layer HTR. For example, the light-emitting layer EML may have a thickness of about 100 Å to about 1000 Å or about 100 Å to about 300 Å. The light-emitting layer EML may have a single layer formed of a single material, a single layer formed of a plurality of different materials, or a multilayer structure having a plurality of layers formed of a plurality of different materials.

Although not illustrated, the light-emitting element ED according to an embodiment may include a plurality of light-emitting layers. A plurality of light-emitting layers may be sequentially stacked and provided, and for example, a light-emitting element ED including a plurality of light-emitting layers may emit white light. The light-emitting element ED including a plurality of light-emitting layers may have a tandem structure.

In the light-emitting element ED of an embodiment, the light-emitting layer EML may include the above-described charge transport compound. The light-emitting layer EML may include the charge transport compound derived from a mixture of an azide compound and a polymer compound containing an aromatic ring group according to an embodiment. For example, when the light-emitting layer EML includes the charge transport compound of an embodiment, the light-emitting layer EML may be formed through a wet process. However, this is an example, and an embodiment of the inventive concept is not limited thereto.

Alternatively, the light-emitting layer may include an anthracene derivative, a pyrene derivative, a fluoranthene derivative, a chrysene derivative, a dihydrobenzanthracene derivative, or a triphenylene derivative. Specifically, the light-emitting layer EML may include the anthracene derivative or the pyrene derivative.

In the light-emitting element ED of an embodiment illustrated in FIGS. 4 to 7, the light-emitting layer EML may include a host and a dopant, and the light-emitting layer EML may include a compound represented by Formula E-1. The compound represented by Formula E-1 may be used as a fluorescent host material.

Formula E-1

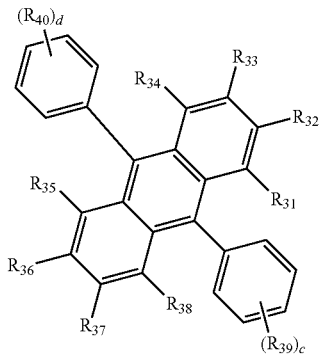

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 carbon atoms, or a substituted or unsubstituted heteroaryl group having 2 to 30 ring-forming carbon atoms, or may be bonded to an adjacent group to form a ring. Meanwhile, any two adjacent groups of $R_{31}$ to $R_{40}$ may be mutually bonded to form a saturated hydrocarbon ring, an unsaturated hydrocarbon ring, a saturated heterocycle, or an unsaturated heterocycle.

In Formula E-1, c and d may each independently be an integer of 0 to 5.

Formula E-1 may be represented by any one of Compound E1 to Compound E19 below.

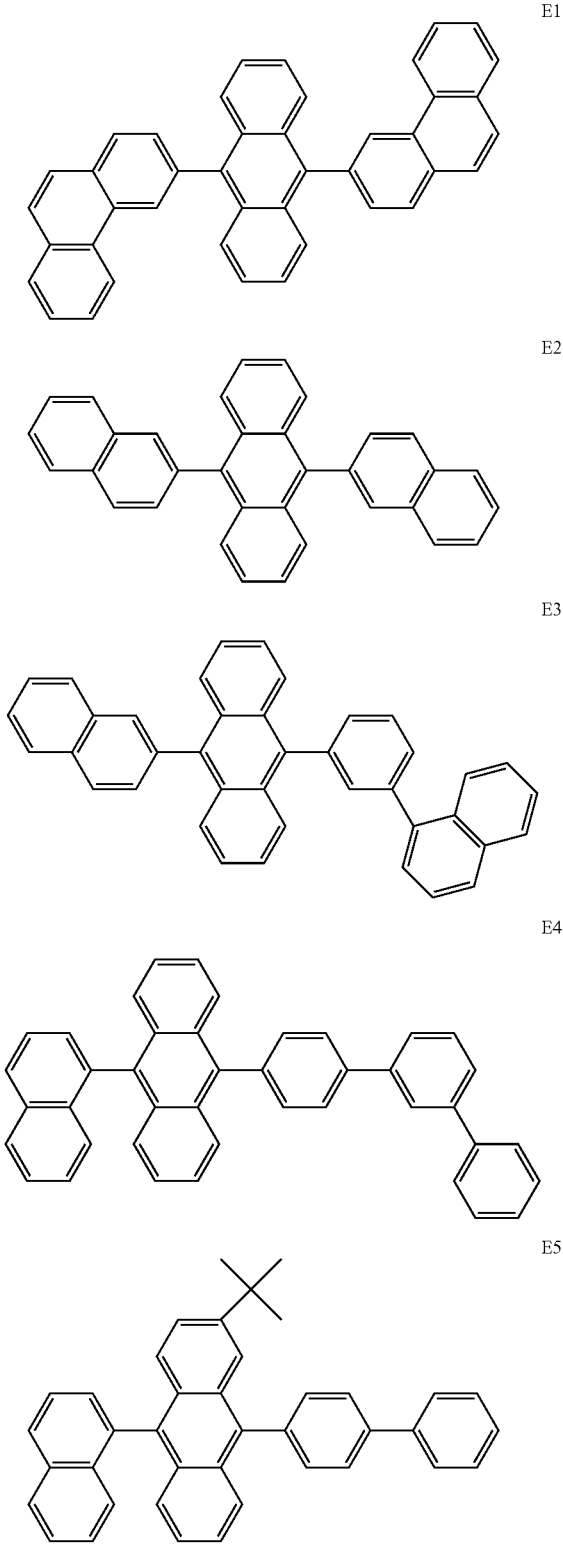

E6
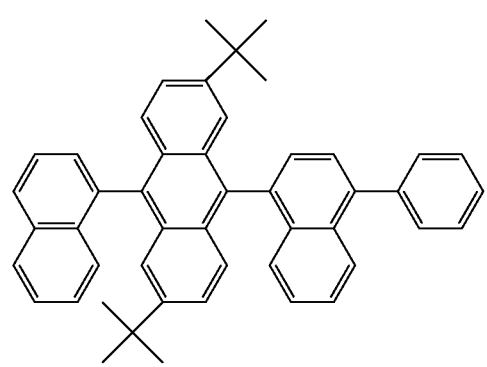
E7
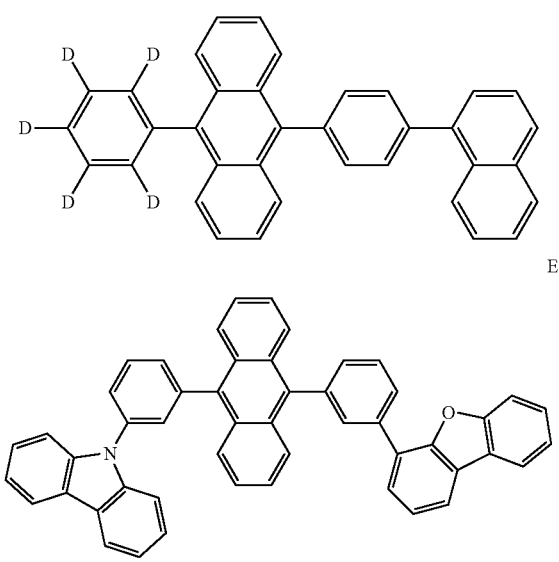
E8
E9
E10
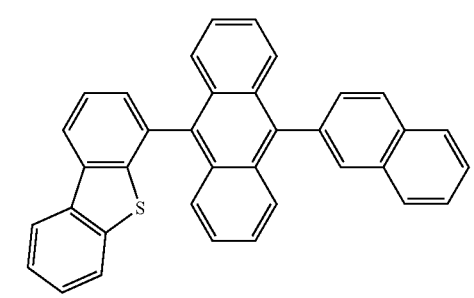
E11
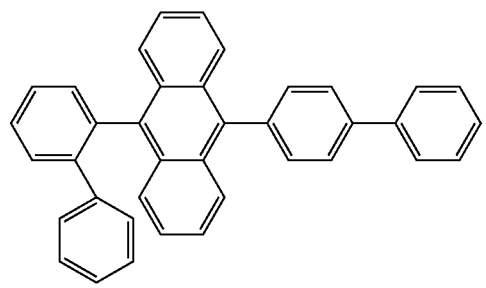
E12
E13
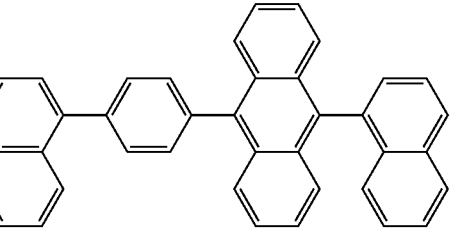
E14
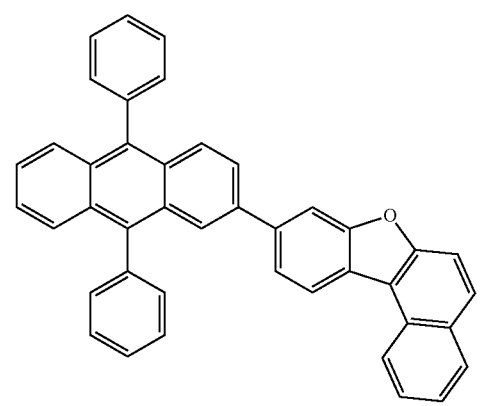

E15

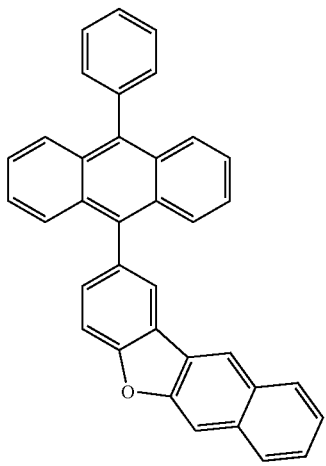

E16

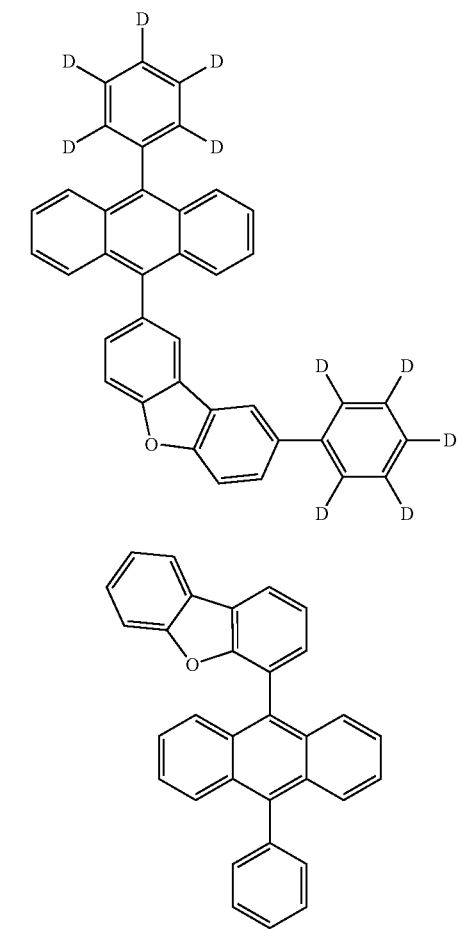

E17

E18

E19

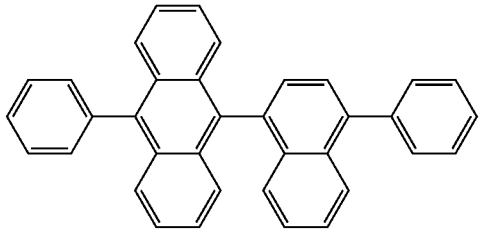

In an embodiment, the light-emitting layer EML may include a compound represented by Formula E-2a or Formula E-2b below. The compound represented by Formula E-2a or Formula E-2b below may be used as a phosphorescent host material.

Formula E-2A

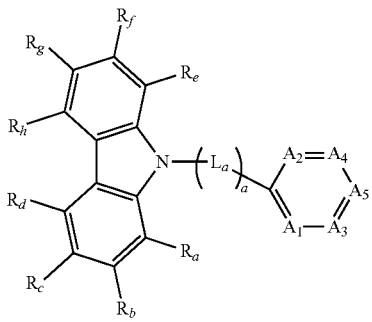

In Formula E-2a, a is an integer of 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. Meanwhile, when a is an integer of 2 or more, a plurality of $L_a$ may each independently be a substituted or unsubstituted arylene group having 6 to 30 ring-forming carbon atoms or a substituted or unsubstituted heteroarylene group having 2 to 30 ring-forming carbon atoms.

In addition, in Formula E-2a, $A_1$ to A5 may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. Moreover, any two adjacent groups Ra to Ri may be mutually bonded to form a hydrocarbon ring or a heterocycle including N, O, S, and the like as ring-forming atoms.

Meanwhile, in Formula E-2a, two or three selected from among $A_1$ to $A_5$ may be N and the rest may be $CR_i$.

Formula E-2b $$(Cbz1) - (L_b)_{\overline{b}} - (Cbz2)$$

In Formula E-2b, Cbz1 and Cbz2 may each independently be an unsubstituted carbazole group or a carbazole group substituted with an aryl group having 6 to 30 ring-forming carbon atoms. $L_b$ may be a direct linkage, a substituted or unsubstituted aryl group having 6 to 30 ring-forming carbon atoms, or a substituted or unsubstituted heteroaryl group having 2 to 30 ring-forming carbon atoms. b is an integer of 0 to 10, and when b is an integer of 2 or more, each of the plurality of $L_b$ may independently be a substituted or unsubstituted aryl group having 6 to 30 ring-forming carbon atoms, or a substituted or unsubstituted heteroaryl group having 2 to 30 ring-forming carbon atoms.

The compound represented by Formula E-2a or Formula E-2b may be represented by any one of the compounds of Compound Group E-2 below. However, the compounds listed in Compound Group E-2 below are provided as an example, and the compound represented by Formula E-2a or Formula E-2b is not limited to the one illustrated in Compound Group E-2 below.

Compound Group E-2

E-2-1
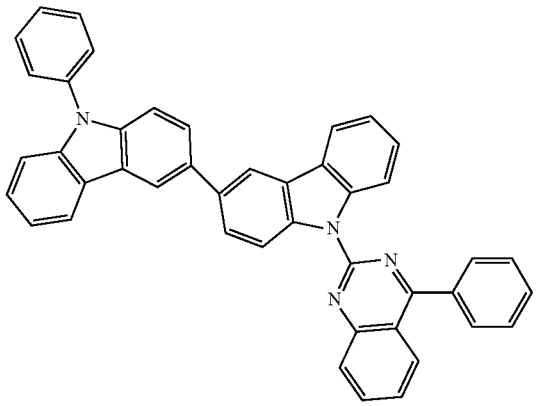

E-2-2
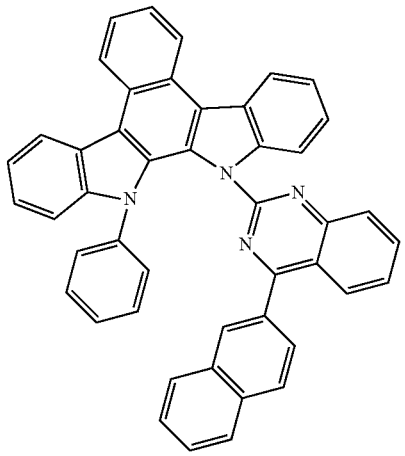

E-2-3
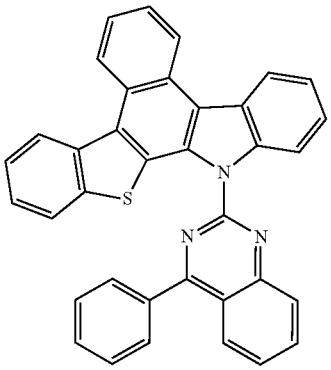

E-2-4
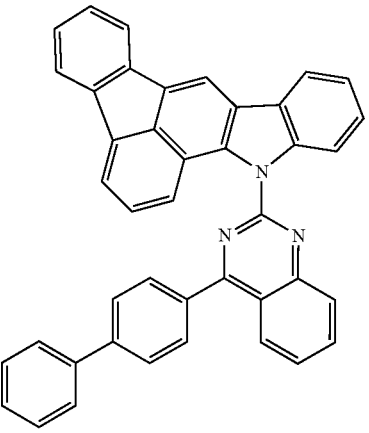

E-2-5
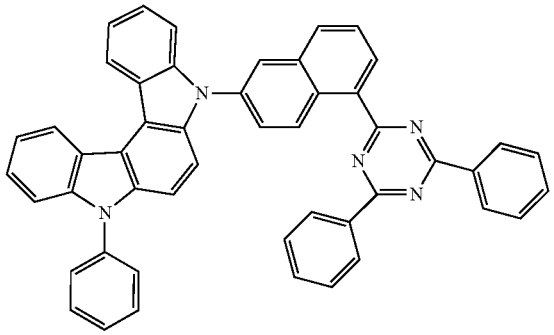

E-2-6
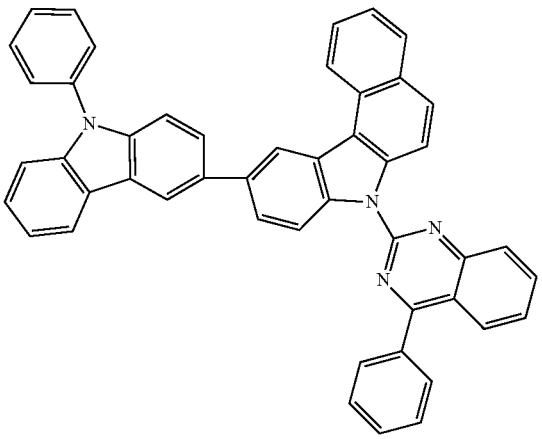

-continued
E-2-7
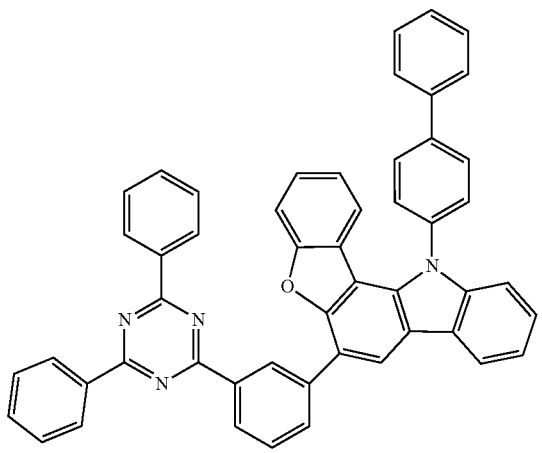
E-2-8
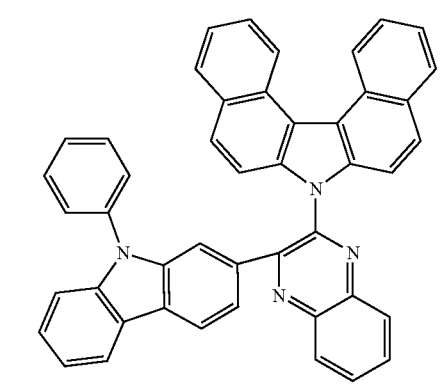
E-2-9
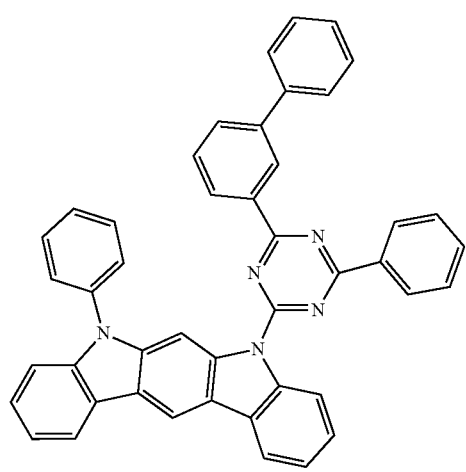
-continued
E-2-10
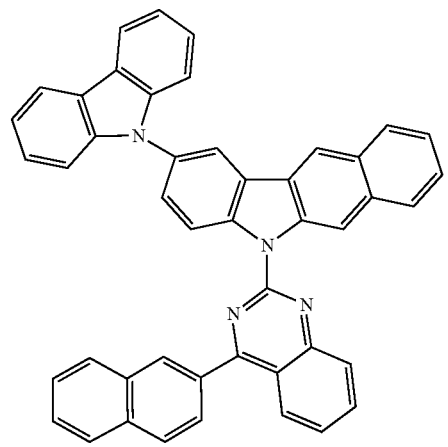
E-2-11
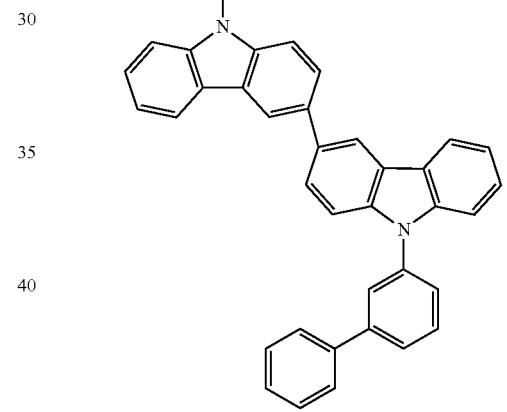
E-2-12
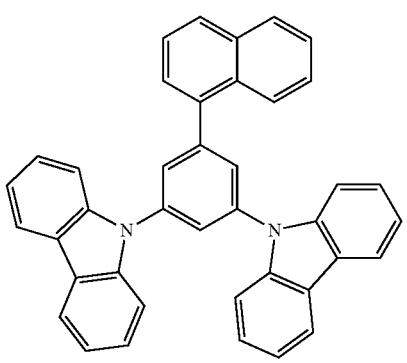

E-2-13
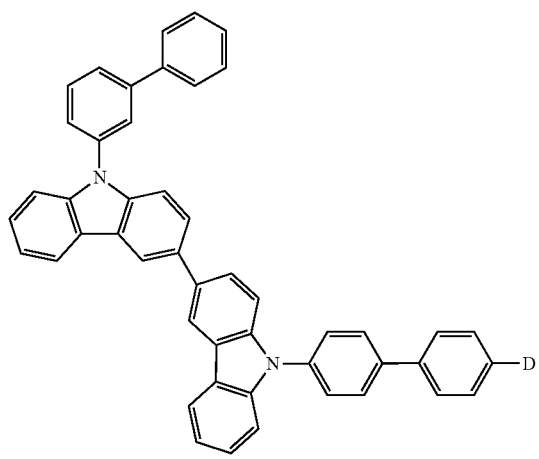
E-2-14
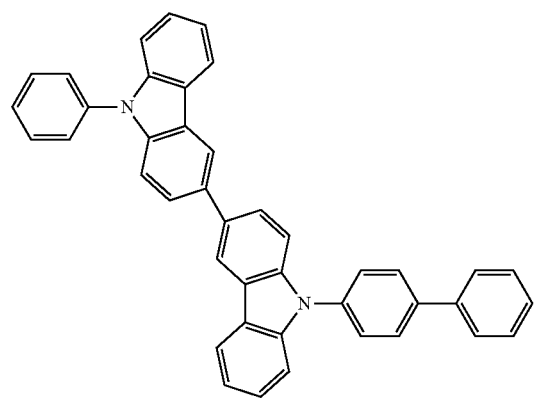
E-2-15
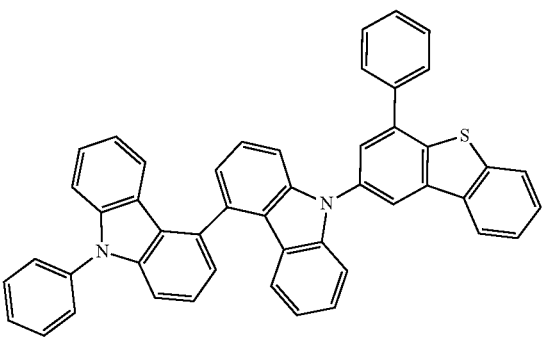
E-2-16
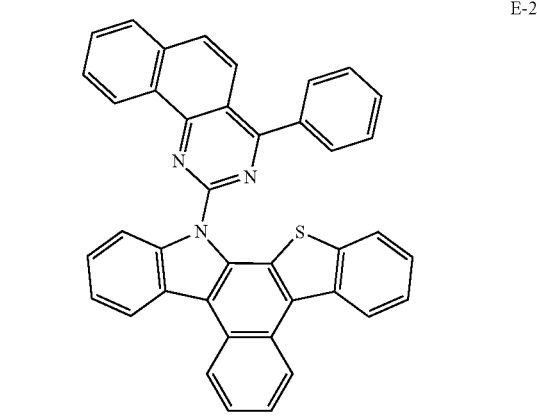
E-2-17
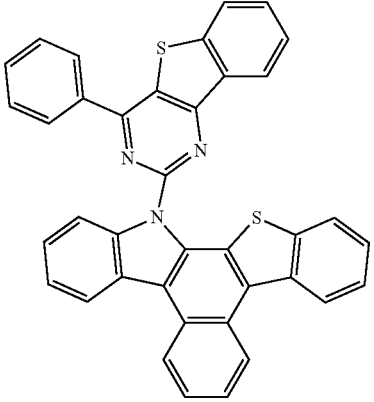
E-2-18
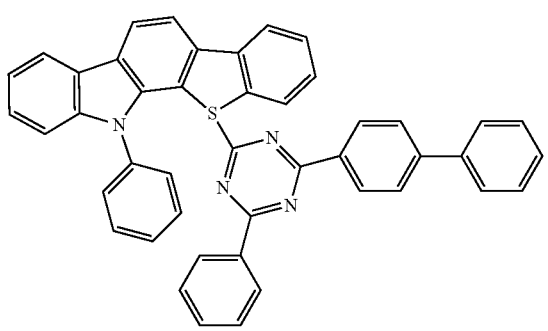
E-2-19
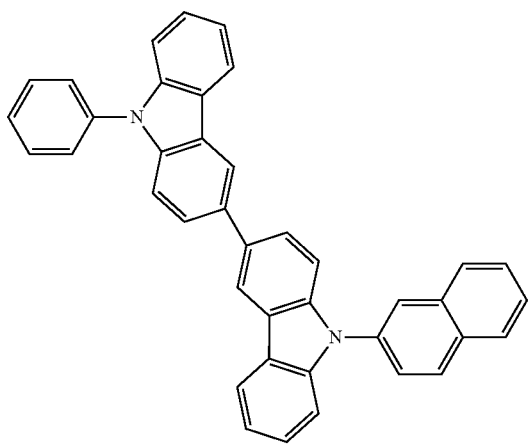
E-2-20
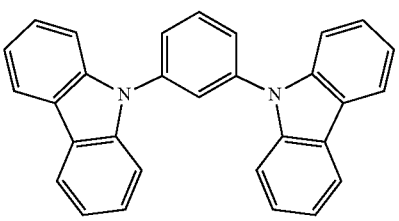

-continued

E-2-21

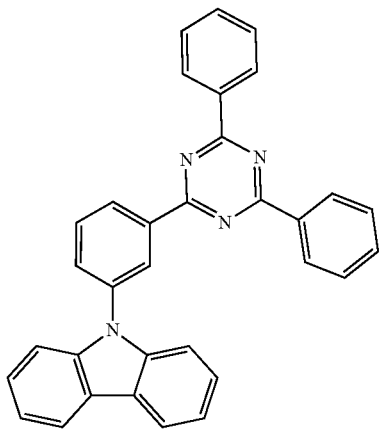

E-2-22

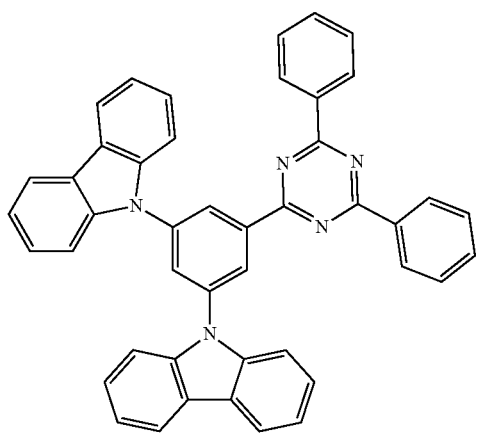

E-2-23

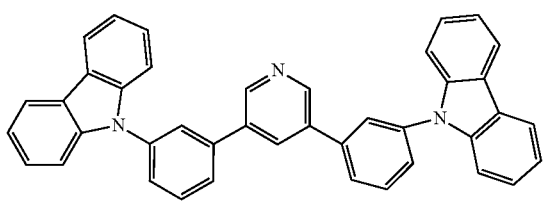

E-2-24

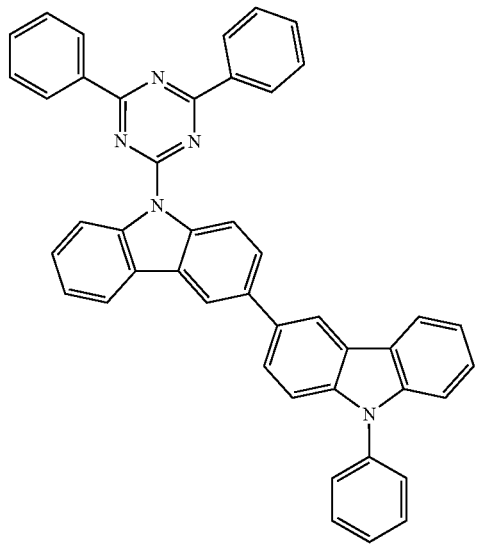

The light-emitting layer EML may further include, as a host material, a general material known in the art. For example, the light-emitting layer EML may include, as a host material, at least one of bis[2-(diphenylphosphino) phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA) or 1,3,5-tris(1-phenyl-1H-benzo[d]imidazole-2-yl)benzene (TPBi). However, an embodiment of the inventive concept is not limited thereto, and for example, tris(8-hydroxyquinolino) aluminum ($Alq_3$), poly(N-vinylcarbazole) (PVK), 9,10-di (naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), and the like may be used as a host material.

The light-emitting layer EML may include a compound represented by Formula M-a or Formula M-b below. The compound represented by Formula M-a or Formula M-b below may be used as a phosphorescent dopant material.

Formula M-a

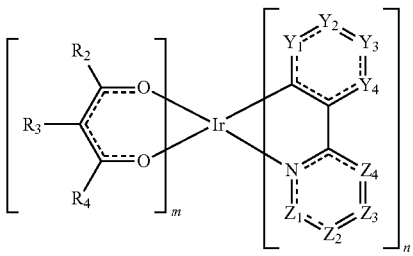

In Formula M-a, $Y_1$ to $Y_4$, and $Z_1$ to $Z_4$ are each independently $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m is about 0 or about 1, and n is 2 or 3. In Formula M-a, when m is 0, n is 3, and when m is 1, n is 2.

A compound represented by Formula M-a may be used as a phosphorescent dopant.

The compound represented by Formula M-a may be represented by any one of compounds M-a1 to M-a25. However, the compounds M-a1 to M-a25 are provided as an example, and the compound represented by Formula M-a is not limited to those represented by the compounds M-a1 to M-a25.

M-a1
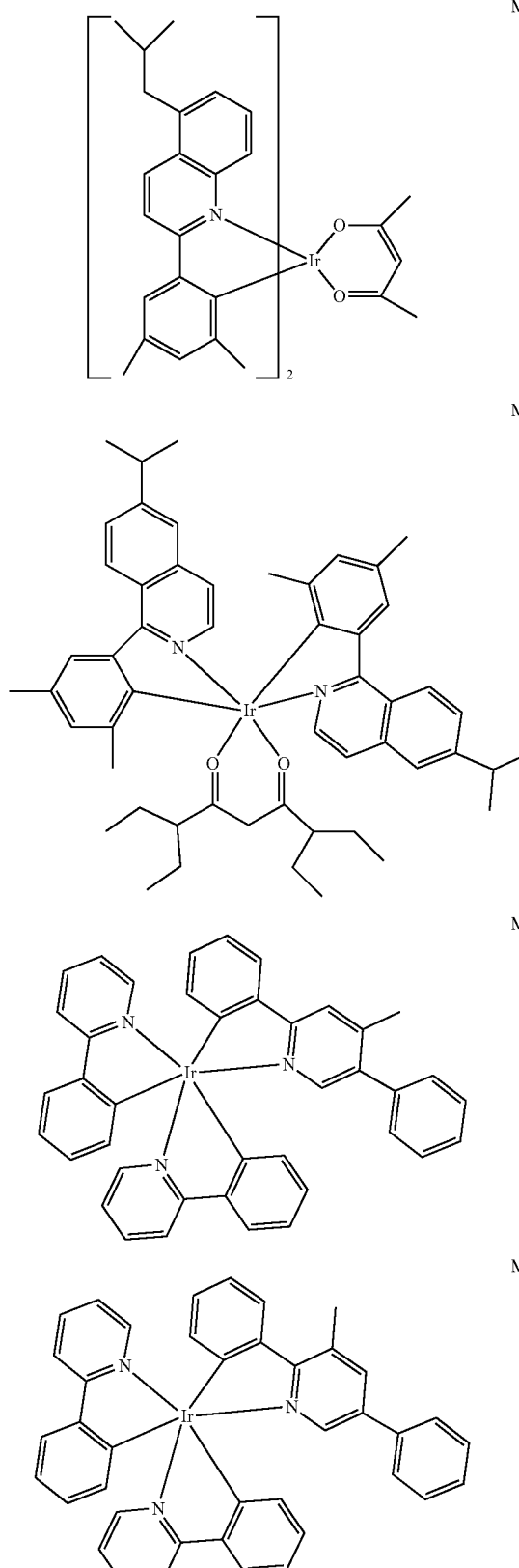
M-a2
M-a3
M-a4
-continued
M-a5
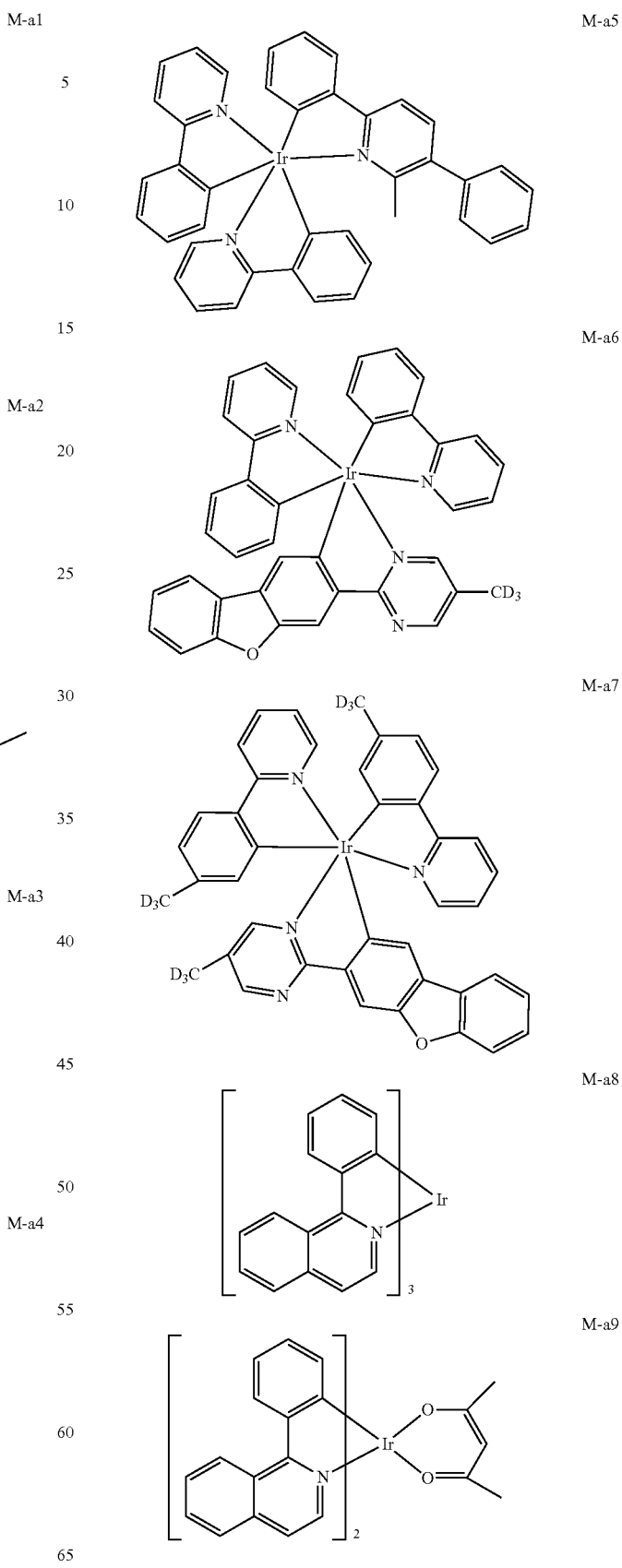
M-a6
M-a7
M-a8
M-a9

-continued
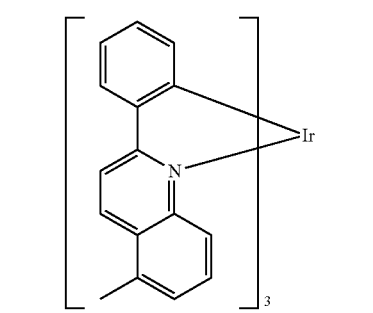 M-a10
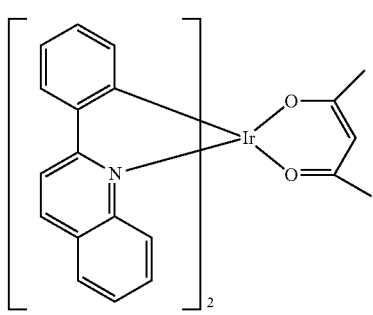 M-a11
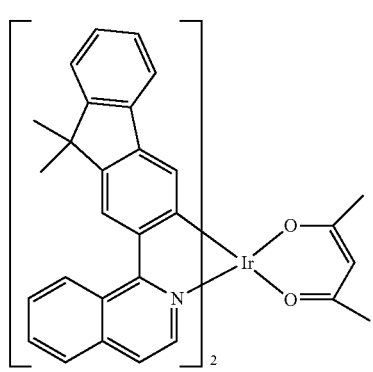 M-a12
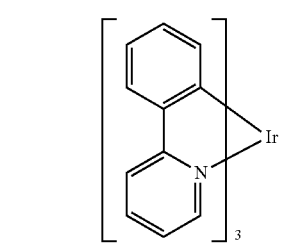 M-a13
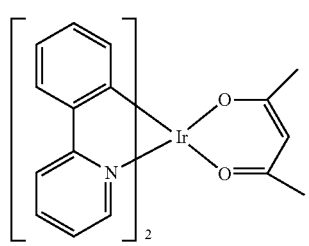 M-a14
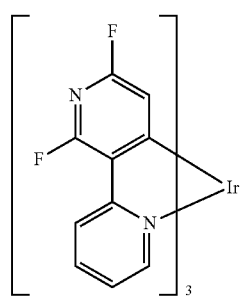 M-a15
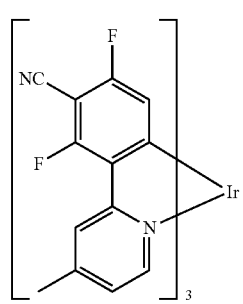 M-a16
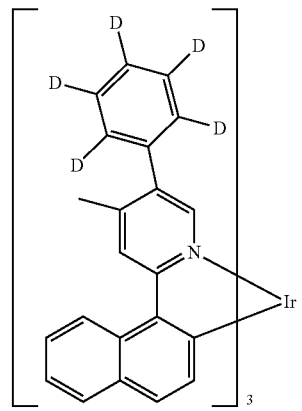 M-a17
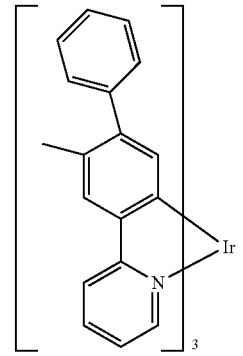 M-a18

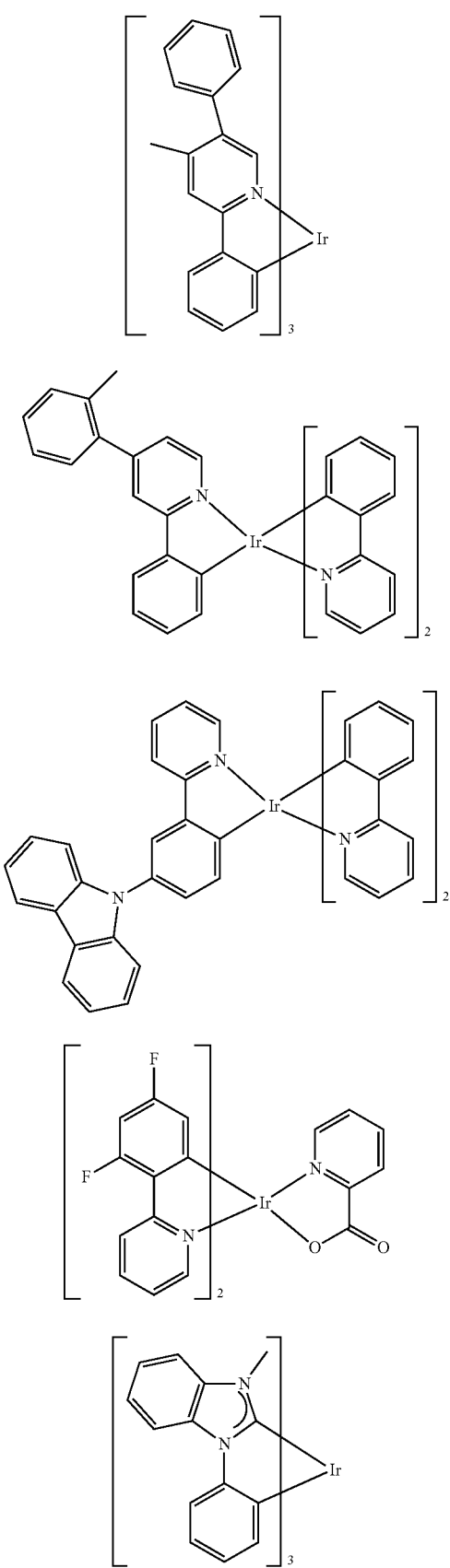

The compounds M-a1 and M-a2 may be used as a red dopant material, and the compounds M-a3 to M-a7 may be used as a green dopant material.

Formula M-b

In Formula M-b, $Q_1$, $Q_2$, $Q_3$, or $Q_4$ are each independently C or N, and C1 to C4 are each independently a substituted or unsubstituted hydrocarbon ring having 5 to 30 ring-forming carbon atoms or a substituted or unsubstituted heterocycle having 2 to 30 ring-forming carbon atoms. $L_{21}$ to $L_{24}$ are each independently a direct linkage, a substituted or unsubstituted alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 are each independently an integer of 0 to 4.

A compound represented by Formula M-b may be used as a blue phosphorescent dopant or a green phosphorescent dopant.

The compound represented by Formula M-b may be represented by any one of the compounds below. However, the compounds below are provided as an example, and the compound represented by Formula M-b is not limited to those represented below.

M-b-1

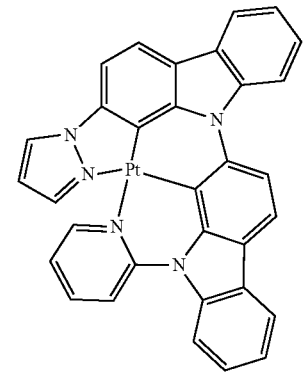

M-b-2

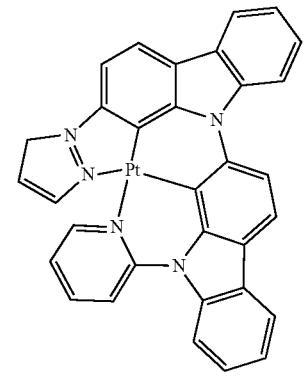

M-b-3

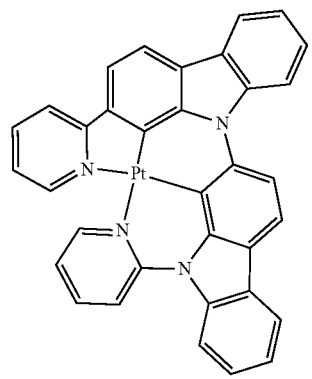

M-b-4

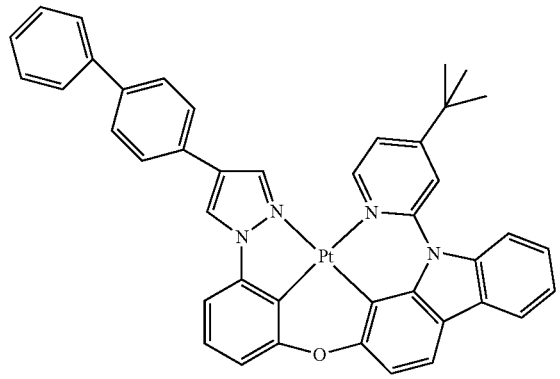

M-b-5

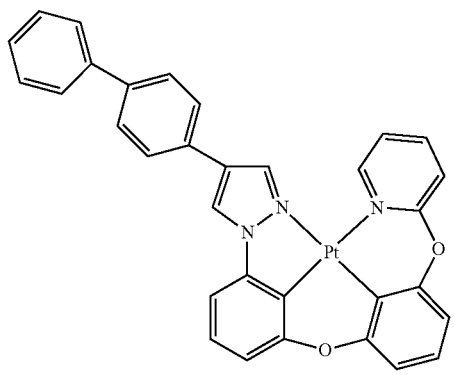

M-b-6

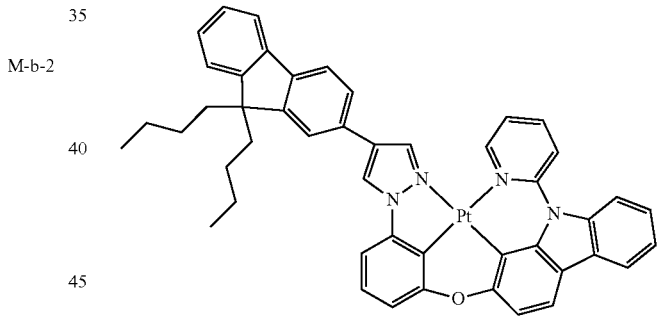

M-b-7

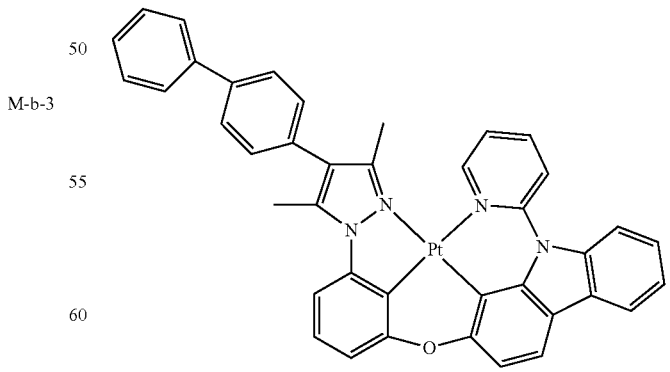

-continued

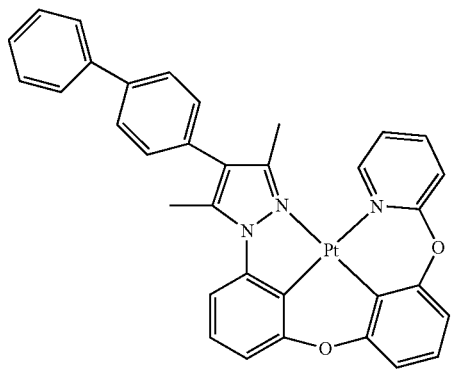
M-b-8

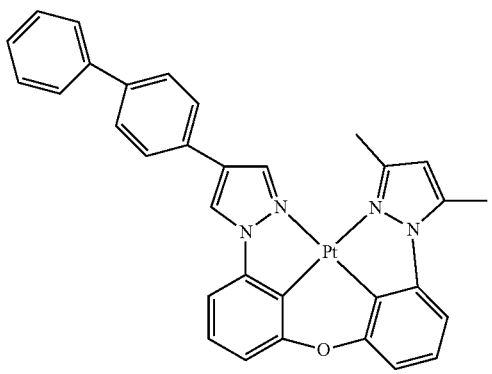
M-b-9

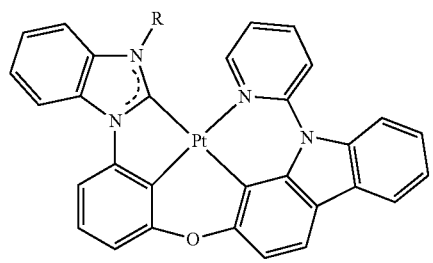
M-b-10

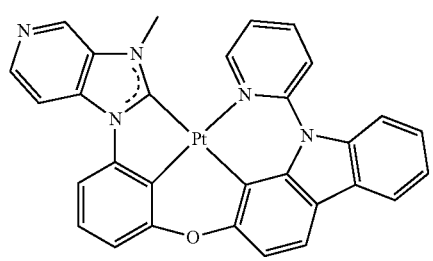
M-b-11

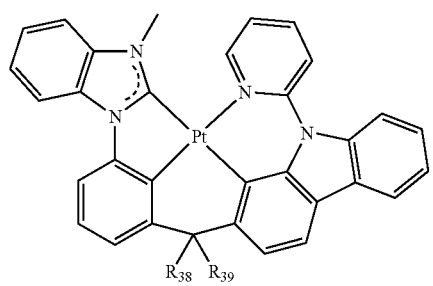
M-b-12

In the above compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The light-emitting layer EML may include a compound represented by any one of Formulas F-a to F-c below. The compounds represented by the Formulas F-a to F-c below may be used as a fluorescent dopant material.

Formula F-a

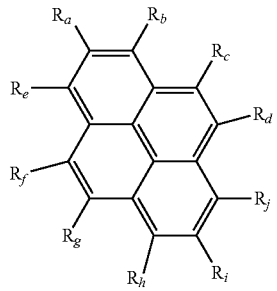

In Formula F-a, two selected from among Ra to Rj may be each independently substituted with *—$NAr_1Ar_2$. The rest of Ra to Rj that are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group including O or S as a ring-forming atom.

Formula F-b

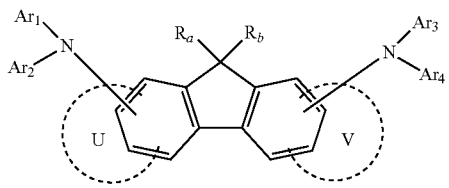

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be mutually bonded to adjacent group to form a ring. $Ar_1$, $Ar_2$, $Ar_3$, and $Ar_4$ may independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

The number of rings represented by U and V in Formula F-b may each independently be about 0 or about 1. For example, in Formula F-b, when the number of U or V is about 1, it means that one ring constitutes a condensed ring in a portion indicated by U or V, or when the number of U or V is about 0, it means that the ring indicated by U or V does not exist. Specifically, when the number of U is about 0 and the number of V is about 1, or when the number of U is about 1 and the number of V is about 0, the condensed ring having a fluorene core in Formula F-b may be a cyclic compound having four rings. In addition, when the numbers of U and V are both about 0, the condensed ring in Formula F-b may be a cyclic compound having three rings. In addition, when the numbers of U and V are both about 1, the condensed ring having a fluorene core in Formula F-b may be a cyclic compound having five rings.

Formula F-c

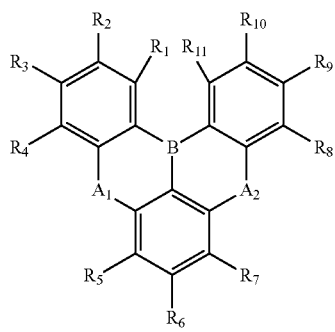

In Formula F-c, $A_1$ and $A_2$ are each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or $R_1$ to $R_{11}$ may be bonded to adjacent groups to form a ring.

In Formula F-c, $A_1$ and $A_2$ may each independently be bonded to substituents of a neighboring ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the light-emitting layer EML may include, as a known dopant material, a styryl derivative (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi)), 4,4'-bis[2-(4-(N,N-diphenylamino) phenyl)vinyl]biphenyl (DPAVBi), perylene and a derivative thereof (for example, 2,5,8,11-tetra-t-butylperylene (TBP)), pyrene and a derivative thereof (for example, 1,1-dipyrene, 1,4-dipyrenylbenzene, 1,4-bis(N, N-diphenylamino) pyrene), and the like.

The light-emitting layer EML may include a known phosphorescent dopant material. For example, as the phosphorescent dopant, a metal complex including iridium (Ir), platinum (Pt), osmium (Os), gold (Au), titanium (Ti), zirconium (Zr), hafnium (Hf), europium (Eu), terbium (Tb), or thulium (Tm) may be used. Specifically, iridium(III) bis(4, 6-difluorophenylpyridinato-N,C2')picolinate (FIrpic), bis(2, 4-difluorophenylpyridinato)-tetrakis(1-pyrazolyl)borate iridium(III) (FIr6), or platinum octaethyl porphyrin (PtOEP) may be used as a phosphorescent dopant. However, an embodiment of the inventive concept is not limited thereto.

The light-emitting layer EML may include a quantum dot material. The core of the quantum dot may be selected from a group II-VI compound, a group III-VI compound, a group compound, a group III-V compound, a group III-II-V compound, a group IV-VI compound, a group IV element, a group IV compound, and combinations thereof.

The group II-VI compound may be a binary compound such as CdSe, CdTe, CdS, ZnS, ZnSe, ZnTe, ZnO, HgS, HgSe, HgTe, MgSe, MgS and a mixture thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-VI compound may include a binary compound such as $In_2S_3$ and $In_2Se_3$, a ternary compound such as $InGaS_3$ and $InGaSe_3$, or any combination thereof.

The group I-III-VI compound may be selected from a ternary compound such as AgInS, $AgInS_2$, CuInS, $CuInS_2$, $AgGaS_2$, $CuGaS_2$ $CuGaO_2$, $AgGaO_2$, $AgAlO_2$ and a mixture thereof, or a quaternary compound such as $AgInGaS_2$, $CuInGaS_2$.

The group III-V compound may be a a binary compound such as GaN, GaP, GaAs, GaSb, AlN, AlP, AlAs, AlSb, InN, InP, InAs, InSb, and a mixture thereof a ternary compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and a mixture thereof; or a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. Meanwhile, the group III-V compound may further include a group II metal. For example, InZnP or the like may be selected as the group III-II-V compound.

The group IV-VI compound may be a a binary compound such as SnS, SnSe, SnTe, PbS, PbSe, PbTe and a mixture thereof a ternary compound such as SnSeS, SnSeTe, SnSTe, PbSeS, PbSeTe, PbSTe, SnPbS, SnPbSe, SnPbTe and a mixture thereof; or a quaternary compound such as SnPbSSe, SnPbSeTe, SnPbSTe and a mixture thereof. The group IV element may be Si, Ge, or a mixture thereof. The group IV compound may be a binary compound such as SiC, SiGe, and a mixture thereof.

In this case, the binary compound, the ternary compound, or the quaternary compound may be present in the particle with a uniform concentration, or may be present in the same particle with partially different concentrations. In addition, a core/shell structure in which one quantum dot surrounds another quantum dot may also be possible. The core/shell structure has a concentration gradient in which the concentration of elements presents in the shell decreases toward the core.

In some embodiments, the quantum dot QD may have the above-described core-shell structure including a core CR containing nanocrystals and a shell SL surrounding the core CR. The shell SL of the quantum dot QD may serve as a protective layer for maintaining semiconductor characteristics by preventing the core CR from being chemically modified, and/or serve as a charging layer for imparting electrophoretic characteristics to the quantum dot QD. The shell SL may be a single layer or a plurality of layers. Examples of the shell SL of the quantum dot QD may include an oxide of metal or non-metal, a semiconductor compound, or a combination thereof.

For example, examples of the oxide of the metal or non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, $CoMn_2O_4$, but an embodiment of the inventive concept is not limited thereto.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but an embodiment of the inventive concept is not limited thereto.

The quantum dot QD may have, in an emission wavelength spectrum, a full width of half maximum (FWHM) of about 45 nm or less, preferably about 40 nm or less, and more preferably about 30 nm or less, and in this range, the color purity or the color reproducibility may be improved. In addition, light emitted through such a quantum dot is emitted in all directions, so that wide viewing angle characteristics may be improved.

In addition, the shape of the quantum dots QD is not particularly limited to a shape commonly used in the field, but, more specifically, the quantum dots QD may have a shape such as a spherical shape, a pyramidal shape, a multi-arm shape, or a cubic nanoparticle, a nanotube, a nanowire, a nanofiber, and a nanoplatelet particle.

The quantum dots QD may control the color of emitted light according to the particle size, and accordingly, the quantum dots QD may have various emission colors such as blue, red, and green.

In the light-emitting element ED of an embodiment illustrated in FIGS. 4 to 7, an electron transport region ETR is provided on the light-emitting layer EML. The electron transport region ETR may include at least one of a hole blocking layer HBL, an electron transport layer ETL, or an electron injection layer EIL. Either of the electron transport layer ETL or the electron injection layer EIL may include the charge transport compound of an embodiment. Either of the electron transport layer ETL or the electron injection layer EIL may include the charge transport compound according to an embodiment, which is derived from a mixture of an azide compound and a polymer compound containing an aromatic ring group. However, this is an example, and the electron transport region ETR may include a compound to be described later.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In addition, the electron transport region ETR may have a structure of single layers formed of a plurality of different materials, or may have a structure such as an electron transport layer ETL/electron injection layer EIL, and a hole blocking layer HBL/electron transport layer ETL/electron injection layer EIL, which are sequentially stacked from the light-emitting layer EML, but an embodiment of the inventive concept is not limited thereto. The thickness of the electron transport region ETR may be, for example, about 1000 Å to about 1,500 Å.

The electron transport region ETR may be formed using various methods such as a vacuum evaporation method, a spin coating method, a cast method, a LB method (Langmuir-Blodgett), an inkjet printing method, a laser printing method, and a laser induced thermal imaging method (LITI). For example, when the electron transport region ETR includes the charge transport compound of an embodiment, the electron transport region ETR may be formed through a wet process such as the inkjet printing method.

The electron transport region ETR may include a compound represented by Formula ET-1.

Formula H-1

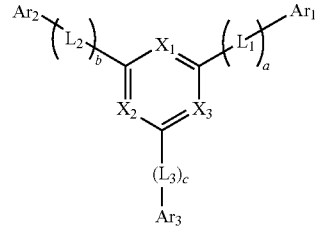

In Formula ET-1, at least of among $X_1$, $X_2$, or $X_3$ is N and the others are $CR_a$. $R_a$ may be a hydrogen atom, a deuterium atom, or a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, or a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a, b, and c may each independently be an integer of 0 to 10. In Formula ET-1, $L_1$, $L_2$, and $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. Meanwhile, when a, b, and c are an integer of 2 or more, $L_1$, $L_2$, and $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the present invention is not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenyly-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (t-Bu-PBD), bis(2-methyl-8-quinolinolato-N1,O8)-(1,1'-biphenyl-4-olato)aluminum (BAlq), berylliumbis(benzoquinolin-10-olate) (Bebq$_2$), 9,10-di(naphthalene-2-yl) anthracene (ADN), 1,3-bis[3,5-di(pyridin-3-yl)phenyl] benzene (BmPyPhB) and a mixture thereof.

In addition, the electron transport region ETR may include a metal halide such as LiF, NaCl, CsF, RbCl, RbI, CuI, and KI, a lanthanum group metal such as Yb, and a co-deposition material of the above-described metal halide and the lanthanum group metal. For example, the electron transport region ETR may include KI:Yb, RbI:Yb, and the like as a co-deposition material. Meanwhile, a metal oxide such as Li$_2$O and BaO, or an 8-hydroxyl-lithium quinolate (Liq), or the like may be used for the electron transport region ETR, but an embodiment of the inventive concept is not limited thereto. In addition, the electron transport region ETR may be formed of a mixed material in which an electron transport material and an insulating organometallic salt are mixed. The organometallic salt may be a material having an energy band gap of about 4 eV or more. Specifically, for example, the organometallic salt may include metal acetate, metal benzoate, metal acetoacetate, metal acetylacetonate or metal stearate.

The electron transport region ETR may further include at least one of 2,9-dimethyl-4,7-diphenyl-1,10-phenanthroline (BCP) or 4,7-diphenyl-1,10-phenanthroline (Bphen) in addition to the above-described material, but an embodiment of the inventive concept is not limited thereto.

The electron transport region ETR may include the above-described compounds of the electron transport region in at least one of the electron injection layer EIL, the electron transport layer ETL, or the hole blocking layer HBL.

When the electron transport region ETR includes the electron transport layer ETL, the thickness of the electron transport layer ETL may be about 100 Å to about 1,000 Å, for example, about 150 Å to about 500 Å. When the thickness of the electron transport layer ETL satisfies the above-described range, satisfactory electron transport characteristics may be obtained without a substantial increase in driving voltage. When the electron transport region ETR includes the electron injection layer EIL, the thickness of the electron injection layer EIL may be about 1 Å to about 100 Å, about 3 Å to about 90 Å. When the thickness of the electron injection layer EIL satisfies the above-described range, satisfactory electron injection characteristics may be obtained without a substantial increase in driving voltage.

A second electrode EL2 is provided on the electron transport region ETR. The second electrode EL2 may be a common electrode. The second electrode EL2 may be a negative electrode or a positive electrode, but an embodiment of the inventive concept is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may include a transparent metal oxide such as indium tin oxide (ITO), indium zinc oxide (IZO), zinc oxide (ZnO), and indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb and W or a compound including the same or a mixture thereof (e.g., AgMg, AgYb, or MgYb). Alternatively, the second electrode EL2 may have a multilayer structure including a reflective film or a semi-transmissive film formed of the above-described material and a transparent conductive film formed of indium tin oxide (ITO), indium zinc oxide (IZO), zinc oxide (ZnO), indium tin zinc oxide (ITZO), and the like. For example, the second electrode EL2 may include the metal material described above, a combination of two or more kinds of metal materials selected from the above metal materials, or oxides of the metal materials described above.

Although not illustrated, the second electrode EL2 may be connected to an auxiliary electrode. When the second electrode EL2 is connected to the auxiliary electrode, the resistance of the second electrode EL2 may be reduced.

Meanwhile, a capping layer CPL may be further disposed on the second electrode EL2 of the light-emitting element ED according to an embodiment. The capping layer CPL may include a multilayer or a single layer. The capping layer CPL may be an organic layer or an inorganic layer. For example, when the capping layer CPL contains an inorganic material, the inorganic material may include an alkali metal compound (for example, LiF), an alkaline earth metal compound (for example, MgF$_2$), SiON, SiN$_x$, SiO$_y$, and the like.

For example, when the capping layer CPL contains an organic material, the organic material may include α-NPD, NPB, TPD, m-MTDATA, Alq3, CuPc, N4,N4,N4',N4'-tetra (biphenyl-4-yl) biphenyl-4,4'-diamine (TPD15), 4,4',4"-tris (carbazol-9-yl) triphenylamine (TCTA), and the like, or may include an epoxy resin, or an acrylate such as a methacrylate. However, an embodiment of the inventive concept is not limited thereto, the capping layer CPL may include at least one of the compounds P1 to P5 below.

P1

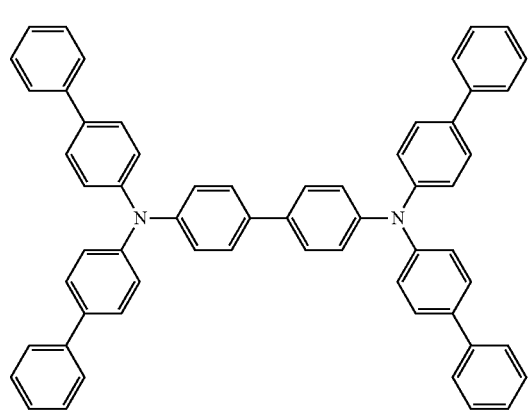

-continued

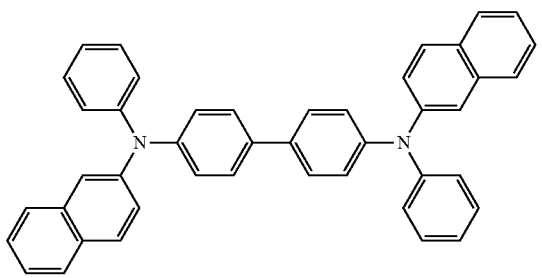
P2

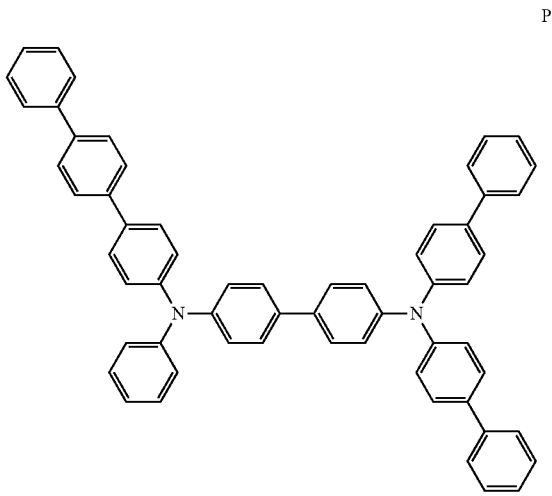
P3

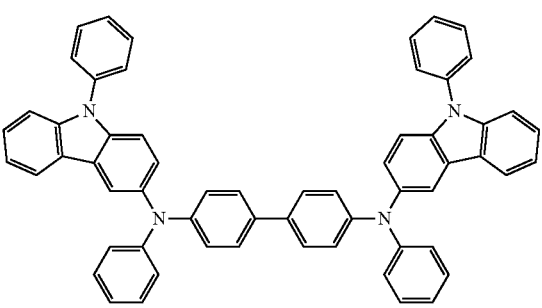
P4

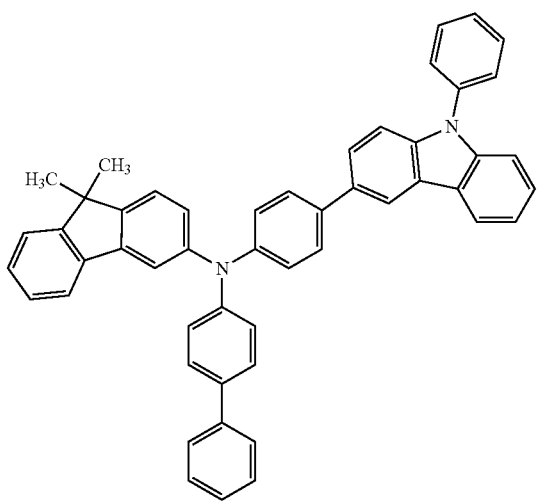
P5

Meanwhile, the refractive index of the capping layer CPL may be about 1.6 or more. Specifically, the capping layer CPL may have a refractive index of about 1.6 or more for light in a wavelength range of about 550 nm to about 660 nm.

Hereinafter, with reference to Examples and Comparative Examples, the charge transport compound according to an embodiment of the inventive concept and the light-emitting element of the embodiment will be described in detail. In addition, Examples illustrated below are exemplarily illustrated to aid understanding of the inventive concept, and the scope of the present invention is not limited thereto.

EXAMPLES

1. Synthesis of Azide Compound

A method for synthesizing an azide compound will be described in detail by exemplifying the method for synthesizing Example Compounds 1 to 3. In addition, a method for synthesizing an azide compound is an example, and a method for synthesizing an azide compound according to an embodiment of the inventive concept is not limited to Examples below.

(1) Compound 1

In a nucleophilic substitution reaction, the chlorine atom of 1-chloro-6,6-dimethylheptan was substituted with an azide group to obtain Compound 1. In a reaction flask, 1-chloro-6,6-dimethylheptane (10 grams (g), 0.061 moles (mol), and sodium azide (8.0 g, 0.123 mol, 2 mole equivalents) were dissolved in dimethylformamide (DMF) solvent under a nitrogen-atmosphere, and the resultant mixture was stirred at room temperature for 12 hours to obtain Compound 1 with a yield of 91%.

(2) Compound 2

In a nucleophilic substitution reaction, the chlorine atom of 1-chloroheptane was substituted with an azide group to obtain Compound 2. In a reaction flask, 1-chloroheptane (10 g, 0.074 mol) and sodium azide (9.7 g, 0.148 mol, 2 mole equivalents) were dissolved in DMF solvent under a nitrogen-atmosphere, and the resultant mixture was stirred at room temperature for 12 hours to obtain Compound 2 with a yield of 92%.

(3) Compound 3

In a nucleophilic substitution reaction, the chlorine atom of 3-(chloromethyl)pentane was substituted with an azide group to obtain Compound 3. In a reaction flask, 3-(chloromethyl)pentane (10 g, 0.083 mol) and sodium azide (10.8 g, 0.165 mol, 2 equivalents) were dissolved in DMF solvent under a nitrogen-atmosphere, and the resultant mixture was stirred at room temperature for 12 hours to obtain Compound 3 with a yield of 87%.

Example Compounds 1, 2, and 3

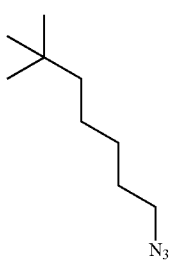

1

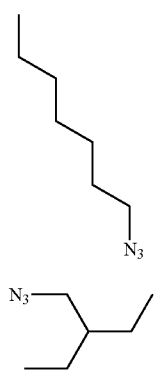

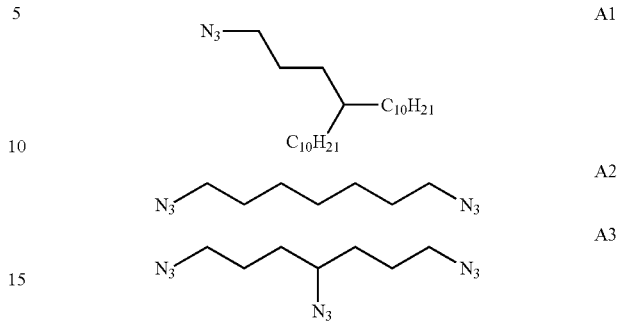

2. Preparation of Charge Transport Material

A charge transport material was prepared by mixing an azide compound and a polymer compound as described below. A combination of the azide compound and the polymer compound used in the preparation of each charge transport material follows. Polyvinylcarbazole (Poly(9-vinylcarbazole)) of Formula 4 was purchased from Sigma-Aldrich.

(1) Preparation of Charge Transport Material 1

Polyvinylcarbazole of Formula 4 and Compound 1 were mixed at a mole ratio of 30:70 at room temperature in anisole as a solvent to provide Charge Transport Material 1 with a concentration of 1.5%.

(2) Preparation of Charge Transport Material 2

Charge Transport Material 2 with a concentration of 1.5% was prepared in the same manner as Charge Transport Material 1 except for using Compound 2 instead of Compound 1.

(3) Preparation of Charge Transport Material 3

Charge Transport Material 3 with a concentration of 1.5% was prepared in the same manner as Charge Transport Material 1 except for using Compound 3 instead of Compound 1.

(4) Preparation of Comparative Example Charge Transport Material 4

Comparative Charge Transport Material 4 with a concentration of 1.5% was prepared by using the polymer compound of polyvinylcarbazole of Formula 4 with anisole as a solvent. In contrast to Charge Transport Material 1, an azide compound is not used in the preparation.

(5) Preparation of Comparative Example Charge Transport Material 5

Comparative Charge Transport Material 5 with a concentration of 1.5% was prepared in the same manner as in Charge Transport Material 1 except for using Comparative Example Compound A1 instead of Compound 1.

(6) Preparation of Comparative Example Charge Transport Material 6

Comparative Charge Transport Material 6 with a concentration of 1.5% was prepared in the same manner as in the Charge Transport Material 1 except for using Comparative Example Compound A2 instead of Compound 1.

(7) Preparation of Comparative Example Charge Transport Material 7

Comparative Charge Transport Material 7 with a concentration of 1.5% was prepared in the same manner as in Charge Transport Material 1 except for using Comparative Example Compound A3 instead of Compound 1.

Azide Compounds used as Comparative Example Compounds

3. Hole Mobility Evaluation

Thin films for evaluating hole mobility were prepared. Thin Films 1, 2, and 3 were prepared using Charge Transport Materials 1, 2, and 3, respectively. In addition, Thin Films 7, 9, 10, and 11 were prepared using Comparative Example Charge Transport Compounds 4, 5, 6, and 7, respectively. A method for making the thin films follows.

A single film is formed from a charge transport material on a space charge limited current (SCLC) measurement substrate using a spin coater, and the deposited material was dried and heat-treated at 230° C. for 30 minutes using a hotplate to obtain a flexible single film. The solvent-treated single film was post-baked in an oven in a nitrogen atmosphere at 180° C. for 30 minutes to provide a 200 nm thin film.

Table 1 lists the measured hole mobility of each thin film as a hole transport layer of a light-emitting element. The light-emitting element did not contain a light-emitting layer or an electron-transport layer, etc., other than the hole transport layer, and was prepared to a thickness of 800 Å.

TABLE 1

| Examples | | Hole mobility (cm$^2$/Vs) |
|---|---|---|
| Charge Transport Material 1 | Thin Film 1 | $2.3 \times 10^{-4}$ |
| Charge Transport Material 2 | Thin Film 2 | $2.5 \times 10^{-4}$ |
| Charge Transport Material 3 | Thin Film 3 | $2.4 \times 10^{-4}$ |
| Comparative Example Charge Transport Material 4 | Thin Film 7 | $2.3 \times 10^{-4}$ |
| Comparative Example Charge Transport Material 5 | Thin Film 9 | $6.7 \times 10^{-5}$ |
| Comparative Example Charge Transport Material 6 | Thin Film 10 | $2.2 \times 10^{-4}$ |
| Comparative Example Charge Transport Material 7 | Thin Film 11 | $2.3 \times 10^{-4}$ |

Referring to Table 1, it may be seen that the hole mobility of Thin Films 1, 2, 3, 7, and 11 is $2.3 \times 10^{-4}$ to $2.5 \times 10^{-4}$. It may be seen that Thin Films 2 and 3 prepared from Material Compounds 2 and 3, which in turn were prepared with azide compounds 2 and 3 have greater hole mobility than Thin Film 7, As noted above, This Film 7 was prepared from Comparative Example Charge Transport Material 4, which was prepared with polymer compound of Formula 4 only— absent any azide compound.

Each of Thin Films 1, 2, and 3 was prepared from a charge transport materials 1, 2, and 3, respectively. Thin Films 10 and 11 was prepared from a Comparative Example Charge Transport Materials containing Comparative Example Compounds A2 and A3, respectively. Thin Film 9 having a hole mobility of $6.7 \times 10^{-5}$ was prepared from the Comparative Example Charge Transport Material 9 containing Comparative Example Compound A1. Charge Transport Materials 1, 2, and 3 and Comparative Example Charge Transport Materials 4 and 7 were determined to have suitable hole mobility for use as charge transport compound of a light-emitting element.

4. Flexibility Evaluation

Thin films were prepared to evaluate flexibility of the thin films, which may be an important feature particularly for a flexible display. Thin Films 4, 5, and 6 were prepared using Charge Transport Materials 1, 2, and 3, respectively. In addition, Thin Films 8 and 12, 13, and 14 were prepared using Charge Transport Materials 4 and 5, 6, and 7, respectively. A method of making the thin films follows.

A single film is formed from charge transport materials on a flexible PDMS film using a spin coater, and was dried and heat-treated at 230° C. for 30 minutes using a hotplate to obtain a flexible single film. The solvent-treated single film was post-baked in an oven in a nitrogen atmosphere at 230° C. for 30 minutes to provide a 900 nm thin film.

(1) Flexibility Evaluation 1

An operation of increasing a strain from 0% to 10%, from 0% to 20%, or from 0% to 30%, and then reducing the strain in each film to 0%. This process of successive strain/release was repeatedly performed 10 times on each of Thin Films 4, 5, 6, 8, and 12, 13, and 14, and the flexibility was evaluated by checking the presence or absence of cracks in each thin film with a microscope. The crack generation is determined on the basis of the criterion that 10 or more cracks of 0.1 micrometers (μm) or more are generated in a 5×5 μm thin film, and the results are shown in Table 2 below. In Table 2, "X" means that there is no crack or less than 10 cracks are generated, and "O" means that 10 cracks or more are generated.

TABLE 2

| Example Thin Film | | 10% | 20% | 30% |
|---|---|---|---|---|
| Charge Transport Material 1 | Thin Film 4 | X | X | O |
| Charge Transport Material 2 | Thin Film 5 | X | X | O |
| Charge Transport Material 3 | Thin Film 6 | X | X | O |
| Comparative Example Charge Transport Material 4 | Thin Film 8 | X | O | O |
| Comparative Example Charge Transport Material 5 | Thin Film 12 | X | X | O |
| Comparative Example Charge Transport Material 6 | Thin Film 13 | X | X | O |
| Comparative Example Charge Transport Material 7 | Thin Film 14 | X | X | O |

Referring to Table 2, it may be seen that Thin Film 8 formed from Comparative Example Charge Transport Material 4 containing only a polymer compound of polyvinyl carbazole has a lower strength than Thin Films 4 to 6 and Thin Films 12 to 14. It may be seen that Thin Films 4, 5, and 6 containing compounds 1, 2, and 3, which are azide compounds of Examples exhibit improved strength. In addition, it may be seen that Thin Films 12, 13, and 14 including Comparative Example Compounds A1, A2, and A3, respectively, also exhibit improved strength. Accordingly, it is considered that a light-emitting element including a charge transport material derived from a mixture of an azide compound and a polymer compound will exhibit improved strength.

(2) Flexibility Evaluation 2

An operation of increasing a strain from 0% to 5%, 0% to 10%, 0% to 15%, or 0% to 20% and then reducing the strain to 0% in each film as described above was repeatedly performed 100 times on Thin Films 4, 5, 6, 8, and 12, 13, and 14, and then the flexibility was evaluated by checking the presence or absence of cracks in each Thin Film with a microscope. Again, crack generation was determined on the basis of the criterion that 10 or more cracks of 0.1 μm or more are generated in a 5×5 μm thin film, and the results are shown in Table 3. As with Table 2, in Table 3, "X" means that there is no crack or less than 10 cracks are generated, and "O" means that 10 cracks or more are generated.

TABLE 3

| Thin Films | | 5% | 10% | 15% | 20% |
|---|---|---|---|---|---|
| Charge Transport Comp. 1 | Thin Film 4 | X | X | X | O |
| Charge Transport Comp. 2 | Thin Film 5 | X | X | O | O |
| Charge Transport Comp. 3 | Thin Film 6 | X | X | O | O |
| Comp. Example Charge Transport Comp. 4 | Thin Film 8 | O | O | O | O |
| Comp. Example Charge Transport Comp. 5 | Thin Film 12 | X | X | O | O |
| Comp. Example Charge Transport Comp. 6 | Thin Film 13 | X | O | O | O |
| Comp. Example Charge Transport Comp. 7 | Thin Film 14 | X | O | O | O |

Referring to Table 3, it may be seen that Thin Films 4 to 6 and Thin Films 12 exhibit improved strength compared to Thin Films 8, 13 and 14. Thin Film 12 contains Comparative Example Compound A1. Each of Thin Films 4 to 6 includes Compounds 1 to 3, which are azide compounds of Examples. In addition, it may be seen that Thin Film 4 exhibits superior strength to Thin Films 5, 6, 8, and 12 to 14. Accordingly, it is considered that the light-emitting element formed of the charge transport material including the azide compound of Example 1 will exhibit improved strength. In addition, it is believed that a display device including a light-emitting element having improved strength will exhibit an improved flexibility.

A charge transport material according to an embodiment may be derived from a mixture of an azide compound and a polymer compound including an aromatic ring group. In the charge-transport material, the polymer compound may be crosslinked by an azide compound. Moreover, the charge transport compound may be provided by a wet process such as by spin-coating.

A light-emitting element according to an embodiment may include a first electrode, a second electrode disposed on the first electrode, and at least one functional layer disposed between the first electrode and the second electrode. The at least one functional layer may be a hole transport layer, a hole injection layer, a light-emitting layer, an electron injection layer, or an electron transport layer. The at least one functional layer may include the charge transport material according to an embodiment, and the at least one functional layer may exhibit an improved flexibility.

In addition, a display device according to an embodiment may include a base layer and a light-emitting element disposed on the base layer. The light-emitting element may include at least one functional layer formed from the charge transport material according to an embodiment. Accordingly, the display device according to an embodiment may exhibit characteristics including improved flexibility and strength.

A light-emitting element and a display device including the same may include a charge transport material derived from an azide compound and a polymer compound, and exhibit improved flexibility.

A charge transport material according to an embodiment may include a polymer material and an azide compound, and may be provided by a wet process.

Although the embodiment of the inventive concept has been described, it is understood that the present invention should not be limited to these embodiments but various changes and modifications may be made by one ordinary skilled in the art within the spirit and scope of the present invention as hereinafter claimed. Accordingly, the technical scope of the present invention should not be limited to the contents described in the detailed description of the specification, but should be determined by the claims.

What is claimed is:

1. A light-emitting element comprising:
a first electrode, a second electrode, and at least one functional layer disposed between the first electrode and the second electrode,
the at least one functional layer including a charge transport material that is derived from a mixture of an azide compound represented by Formula 1 and a polymer compound including an aromatic ring group:

Formula 1

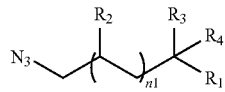

wherein, in Formula 1,
n1 is an integer of 1 to 9,
$R_1$ and $R_2$ are each independently a hydrogen atom or an optionally substituted alkyl group having 1 to 10 carbon atoms,
$R_3$ and $R_4$ are each independently a hydrogen atom or an optionally substituted alkyl group having 1 to 9 carbon atoms,
wherein a mole ratio of moles of the azide compound of Formula 1 to moles of the polymer compound is about 1:1.85 to about 1:3.0, and the azide compound includes only one azide group.

2. The light-emitting element of claim 1, wherein the charge transport material is formed by crosslinking the polymer compound with the azide compound.

3. The light-emitting element of claim 1, wherein the polymer compound comprises poly(triphenylamine), poly(9,9-dioctylfluorene-alt-N-(4-sec-butylphenyl)-diphenylamine), poly(p-phenylenevinylene), polythiophenes, poly(p-phenylene), polyfluorenes, or cyano-poly(p-phenylene vinylene), or the polymer compound is a polyvinylcarbazole represented by Formula 4:

Formula 4

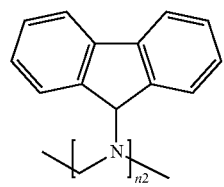

wherein, in Formula 4, n2 is an integer of 100 to 300.

4. The light-emitting element of claim 1, wherein the at least one functional layer comprises: a light-emitting layer; a hole transport region disposed between the first electrode and the light-emitting layer; and an electron transport region disposed between the light-emitting layer and the second electrode, and
the hole transport region includes the charge transport material.

5. The light-emitting element of claim 4, wherein the hole transport region includes a hole injection layer disposed on the first electrode and a hole transport layer disposed on the hole injection layer, and
at least one of the hole injection layer or the hole transport layer includes the charge transport material.

6. The light-emitting element of claim 1, wherein the at least one functional layer comprises: a light-emitting layer; a hole transport region disposed between the first electrode and the light-emitting layer; and an electron transport region disposed between the light-emitting layer and the second electrode, and
the electron transport region comprises the charge transport material.

7. The light-emitting element of claim 1, wherein the at least one functional layer comprises: a light-emitting layer; a hole transport region disposed between the first electrode and the light-emitting layer; and an electron transport region disposed between the light-emitting layer and the second electrode, and
the light-emitting layer includes the charge transport material.

8. The light-emitting element of claim 1, wherein the azide compound is represented by a compound of Compound Group 1:

Compound Group 1

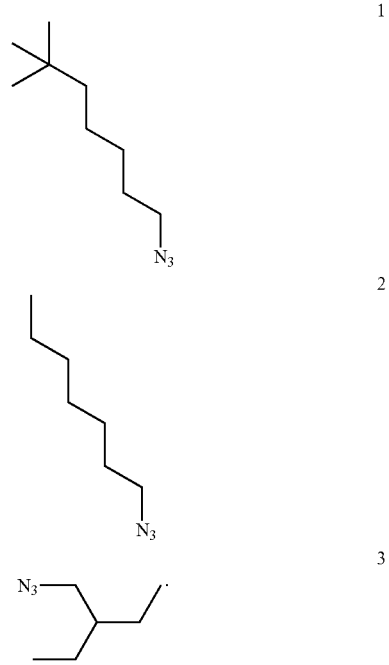

9. A display device comprising:
a base layer, and a light-emitting element disposed on the base layer, wherein the light-emitting element comprises:
a first electrode, a second electrode, and at least one functional layer disposed between the first electrode and the second electrode,
the at least one functional layer including a charge transport material derived from a mixture of an azide compound represented by Formula 1 and a polymer compound including an aromatic ring group:

Formula 1

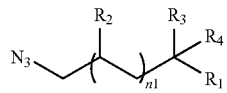

wherein, in Formula 1,
n1 is an integer of 1 to 9,
$R_1$ and $R_2$ are each independently a hydrogen atom or an optionally substituted alkyl group having 1 to 10 carbon atoms,
$R_3$ and $R_4$ are each independently a hydrogen atom or an optionally substituted alkyl group having 1 to 9 carbon atoms,
wherein a mole ratio of moles of the azide compound of Formula 1 to moles of the polymer compound is about 1:1.85 to about 1:3.0, and the azide compound includes only one azide group.

10. The display device of claim 9, wherein the display device has a first state in which the display device has a first area on a plane; and a second state in which the display device has a second area on the plane that is larger than the first area.

11. The display device of claim 9, wherein the display device has a folded state and a non-folded state, and
the display device comprises a folding region that is folded with respect to a folding axis which is a virtual line extending in a first direction in the folding state, and a first non-folding region and a second non-folding region which are spaced apart from each other in a second direction perpendicular to the first direction.

12. The display device of claim 9, wherein the at least one functional layer comprises a light-emitting layer, a hole transport region disposed between the first electrode and the light-emitting layer, and an electron transport region disposed between the light-emitting layer and the second electrode, and
the hole transport region includes a hole injection layer disposed on the first electrode and a hole transport layer disposed on the hole injection layer, and
at least one of the hole injection layer or the hole transport layer includes the charge transport material.

13. The display device of claim 10, wherein the at least one functional layer comprises a light-emitting layer, a hole transport region disposed between the first electrode and the light-emitting layer, and an electron transport region disposed between the light-emitting layer and the second electrode, and
the electron transport region comprises an electron injection layer and an electron transport layer disposed between the light emitting layer and the electron injection layer, and
at least one of the light-emitting layer, the electron injection layer, or the electron transport layer includes the charge transport material.

14. The display device of claim 9, wherein the at least one functional layer is formed by applying the charge transport material by a wet process.

15. The display device of claim 9, wherein the display device is a personal digital terminal, a tablet, a car navigation unit, a game machine, or a wearable device.

16. A charge transport material derived from a mixture of an azide compound represented by Formula 1 and a polymer compound including an aromatic ring group:

Formula 1

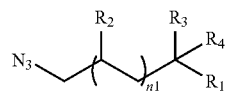

wherein, in Formula 1,
n1 is an integer of 1 to 9,
$R_1$ and $R_2$ are each independently a hydrogen atom or an optionally substituted alkyl group having 1 to 10 carbon atoms,
$R_3$ and $R_4$ are each independently a hydrogen atom or an optionally substituted alkyl group having 1 to 9 carbon atoms,
wherein with respect to the total number of moles of the azide compound and the polymer compound in the charge transport material, the mole percent of the azide compound is about 25 mol % to about 35 mol %, and the azide compound includes only one azide group.

17. The charge transport material of claim 16, wherein the polymer compound comprises poly(triphenylamine), poly (9,9-dioctylfluorene-alt-N-(4-sec-butylphenyl)-diphenylamine), poly(p-phenylenevinylene), polythiophenes, poly(p-phenylene), polyfluorenes, or cyano-poly(p-phenylene vinylene) or the polymer compound is a polyvinylcarbazole represented by Formula 4:

Formula 4

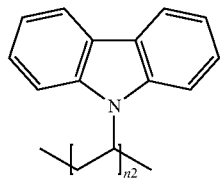

wherein, in Formula 4, n2 is an integer of 100 to 300.

18. The charge transport material of claim 16, wherein Formula 1 is represented by any one of the compounds of Compound Group 1:

Compound Group 1

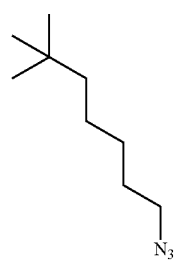

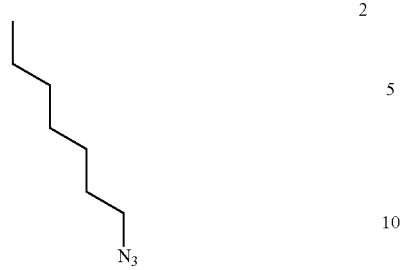
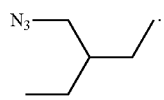
* * * * *